(12) United States Patent
Okinoi

(10) Patent No.: US 11,626,867 B2
(45) Date of Patent: Apr. 11, 2023

(54) VARIABLE DELAY CIRCUIT AND SEMICONDUCTOR INTEGRATED CIRCUIT

(71) Applicant: Socionext Inc., Kanagawa (JP)

(72) Inventor: Masanori Okinoi, Yokohama (JP)

(73) Assignee: Socionext Inc., Kanagawa (JP)

( * ) Notice: Subject to any disclaimer, the term of this patent is extended or adjusted under 35 U.S.C. 154(b) by 0 days.

(21) Appl. No.: 17/457,457

(22) Filed: Dec. 3, 2021

(65) Prior Publication Data
US 2022/0094345 A1 Mar. 24, 2022

Related U.S. Application Data

(63) Continuation of application No. PCT/JP2019/024670, filed on Jun. 21, 2019.

(51) Int. Cl.
*H03K 5/14* (2014.01)
*H03K 5/135* (2006.01)

(52) U.S. Cl.
CPC ............... *H03K 5/135* (2013.01); *H03K 5/14* (2013.01)

(58) Field of Classification Search
None
See application file for complete search history.

(56) References Cited

U.S. PATENT DOCUMENTS

| | | | |
|---|---|---|---|
| 6,049,239 A | 4/2000 | Eto et al. | |
| 6,259,330 B1 | 7/2001 | Arai | |
| 6,426,985 B1 | 7/2002 | Iwata et al. | |
| 9,203,387 B2* | 12/2015 | Huang | H03K 5/14 |
| 9,564,909 B1 | 2/2017 | Iorga et al. | |
| 2005/0024107 A1 | 2/2005 | Takai et al. | |
| 2009/0072871 A1* | 3/2009 | Tokuhiro | H03K 5/135 327/158 |
| 2013/0342255 A1* | 12/2013 | Satsukawa | H03K 5/14 327/276 |

FOREIGN PATENT DOCUMENTS

| | | |
|---|---|---|
| JP | H10-276074 | 10/1998 |
| JP | 2000-183698 | 6/2000 |
| JP | 2000-196424 | 7/2000 |
| JP | 2005-051673 | 2/2005 |
| JP | 2013-005177 | 1/2013 |

OTHER PUBLICATIONS

International Search Report of Int. Appl. No. PCT/JP2019/024670 dated Sep. 17, 2019.

* cited by examiner

*Primary Examiner* — Cassandra F Cox
(74) *Attorney, Agent, or Firm* — IPUSA, PLLC

(57) ABSTRACT

A variable delay circuit includes at least one first delay circuit and a second delay circuit. The first delay circuit includes multiple first delay elements connected in series and is configured to output a delay signal from a first stage first delay element that is a first stage of the first delay circuit. The second delay circuit includes at least one second delay element and multiple third delay elements connected in series. The second delay circuit is configured to output a delay signal from a first stage second delay element that is a first stage of the second delay circuit. The first stage first delay element and the first stage second delay element are connected in series. A delay signal obtained by delaying an input signal received at one circuit among the first delay circuit and the second delay circuit for a predetermined time duration is output from another circuit.

16 Claims, 13 Drawing Sheets

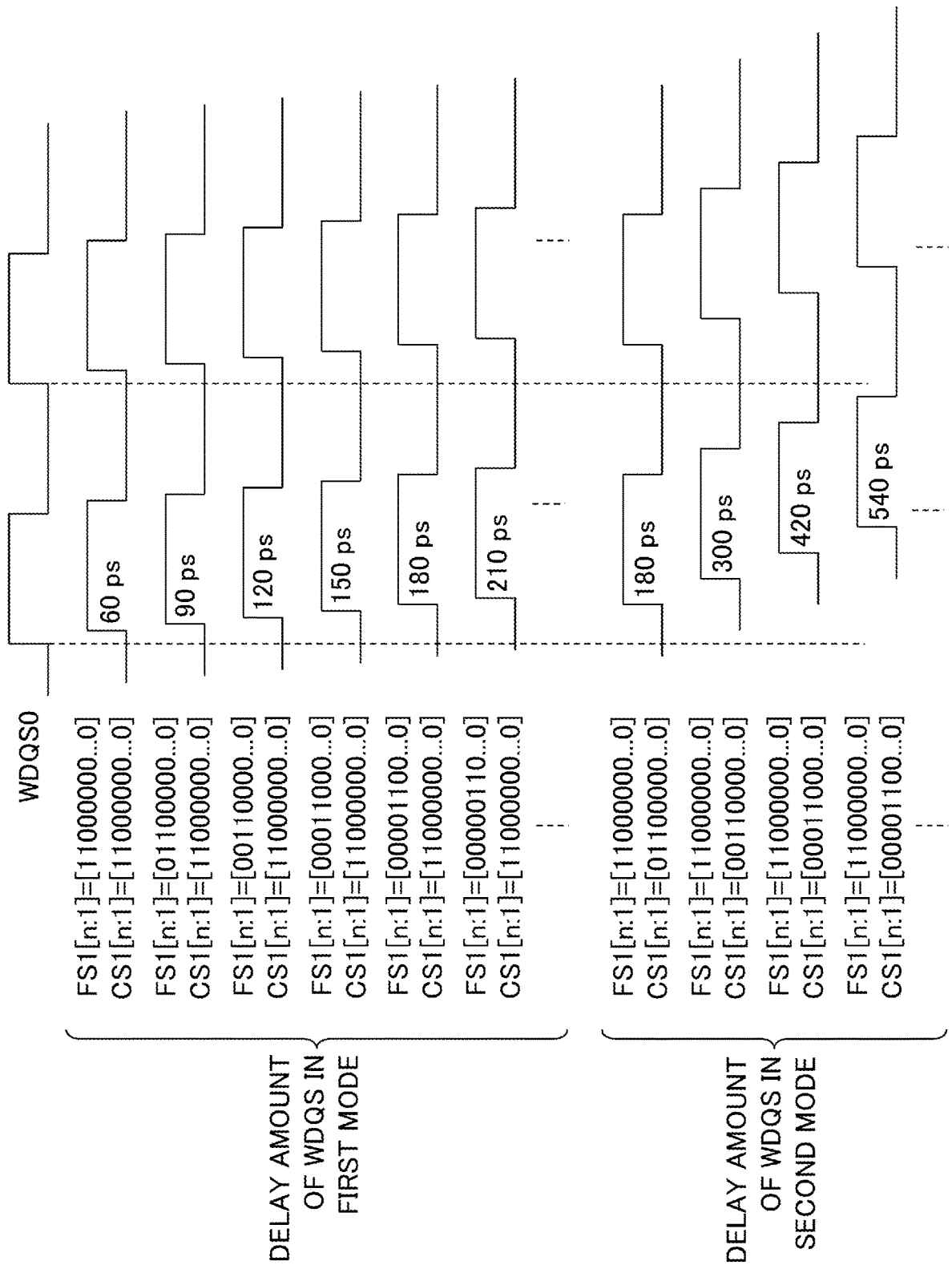

FIG.8

| OPERATION MODE | MAXIMUM OPERATING FREQUENCY | MAXIMUM TRANSMISSION RATE | ONE PERIOD | NUMBER OF NECESSARY DELAY ELEMENTS | | REMARKS |
|---|---|---|---|---|---|---|
| | | | | FD | CD | |
| Mode 9 | 333 MHz | 666 Mbps | 3003 ps | 100 STAGES | 0 STAGES | FIRST MODE (FCMODE = "0") FD1-FDn AND CD1 ARE USED CHANGE AMOUNT OF DELAY TIME = 30 ps |
| Mode 8 | 266 MHz | 532 Mbps | 3759 ps | 125 STAGES | 0 STAGES | |
| Mode 7 | 200 MHz | 400 Mbps | 5000 ps | 0 STAGES | 41 STAGES | SECOND MODE (FCMODE = "1") FD1 AND CD1-CDn ARE USED CHANGE AMOUNT OF DELAY TIME = 120 ps |
| Mode 6 | 166 MHz | 332 Mbps | 6024 ps | 0 STAGES | 50 STAGES | |
| Mode 5 | 133 MHz | 266 Mbps | 7519 ps | 0 STAGES | 62 STAGES | |
| Mode 4 | 100 MHz | 200 Mbps | 10000 ps | 0 STAGES | 83 STAGES | |
| Mode 3 | 83 MHz | 166 Mbps | 12048 ps | 0 STAGES | 100 STAGES | |
| Mode 2 | 66 MHz | 132 Mbps | 15152 ps | 0 STAGES | 126 STAGES | |
| Mode 1 | 40 MHz | 80 Mbps | 25000 ps | 0 STAGES | 208 STAGES | 256 STAGES OF CDs ARE USED |
| Mode 0 | 33 MHz | 66 Mbps | 30303 ps | 0 STAGES | 253 STAGES | |

US 11,626,867 B2

VARIABLE DELAY CIRCUIT AND SEMICONDUCTOR INTEGRATED CIRCUIT

CROSS-REFERENCE TO RELATED APPLICATIONS

This application is a continuation application of International Application No. PCT/JP2019/024670 filed on Jun. 21, 2019, and designated the U.S., the entire contents of which are incorporated herein by reference.

FIELD

The disclosure herein relates to a delay circuit and a semiconductor integrated circuit.

BACKGROUND

For example, a semiconductor integrated circuit includes a variable delay circuit that adjusts a delay time duration of a signal to adjust an operation timing of an internal circuit. Such a variable delay circuit includes a coarse adjustment block with a coarse delay time adjustment interval and a fine adjustment block with a fine delay time adjustment unit that is connected in series to the coarse adjustment block. For example, the fine adjustment block includes a capacitive element that interrupts a signal transmission path. Alternatively, the variable delay circuit includes multiple delay circuits that delay a signal and a selector that selects any one of the delay signals output from the multiple delay circuits.

In a semiconductor integrated circuit that controls access to a memory device or the like in which the operating frequency can be changed, when an output signal to be output to a memory device or the like is delayed relative to a reference timing signal, an output signal having a delay amount corresponding to the operating frequency is generated by the variable delay circuit. The delay amount in the output signal generated by the variable delay circuit is required to correspond to the maximum operating frequency and the minimum operating frequency of the memory device. However, in the variable delay circuit in which the coarse adjustment block and the fine adjustment block are connected in series, the minimum delay amount cannot be less than a delay amount of one stage of the delay element of the coarse adjustment block. Therefore, depending on the maximum operating frequency of the memory device, the variable delay circuit is likely to be unable to generate an output signal having a delay amount corresponding to the maximum operating frequency.

RELATED-ART DOCUMENTS

Patent Documents

[Patent Document 1] Japanese Patent No. 3430046
[Patent Document 2] Japanese Patent No. 3560319

SUMMARY

According to an embodiment of the present invention, a variable delay circuit includes at least one first delay circuit and a second delay circuit. The at least one first delay circuit includes a plurality of first delay elements connected in series. Each of the plurality of first delay elements has a first delay time duration. The at least one first delay circuit is configured to set each of the plurality of first delay elements, in accordance with a first control signal, to a return state in which a received signal is returned to an input side or to a transfer state in which the received signal is transferred to an output side and a signal received from the output side is transferred to the input side, and output a first delay signal from a first stage first delay element. The first stage first delay element is a first stage of the at least one first delay circuit among the plurality of first delay elements. The first delay signal is obtained by delaying a signal received at the first stage first delay element. The second delay circuit includes at least one second delay element and a plurality of third delay elements. The at least one second delay element has a same configuration as the plurality of first delay elements. Each of the plurality of third delay elements has a second delay time duration longer than the first delay time duration. The at least one second delay element and the plurality of third delay elements is connected in series. The second delay circuit is configured to set each of the at least one second delay element and the plurality of third delay elements, in accordance with a second control signal, to a return state in which a received signal is returned to an input side or to a transfer state in which the received signal is transferred to an output side and a signal received from the output side is transferred to the input side, and output a second delay signal from a first stage second delay element. The first stage second delay element is a first stage of the second delay circuit among the at least one second delay element. The second delay signal is obtained by delaying a signal received at the first stage second delay element. The first stage first delay element and the first stage second delay element are connected in series. A delay signal obtained by delaying an input signal received at one circuit among the at least one first delay circuit and the second delay circuit for a predetermined time duration is output from another circuit among the at least one first delay circuit and the second delay circuit.

BRIEF DESCRIPTION OF THE DRAWINGS

FIG. 7 is a diagram illustrating a waveform of a delay write timing signal output by the variable delay circuit in FIG. 3;

FIG. 8 is a diagram illustrating control of the variable delay circuit performed by a delay control circuit in FIG. 1;

DESCRIPTION OF THE EMBODIMENTS

Figure 1:
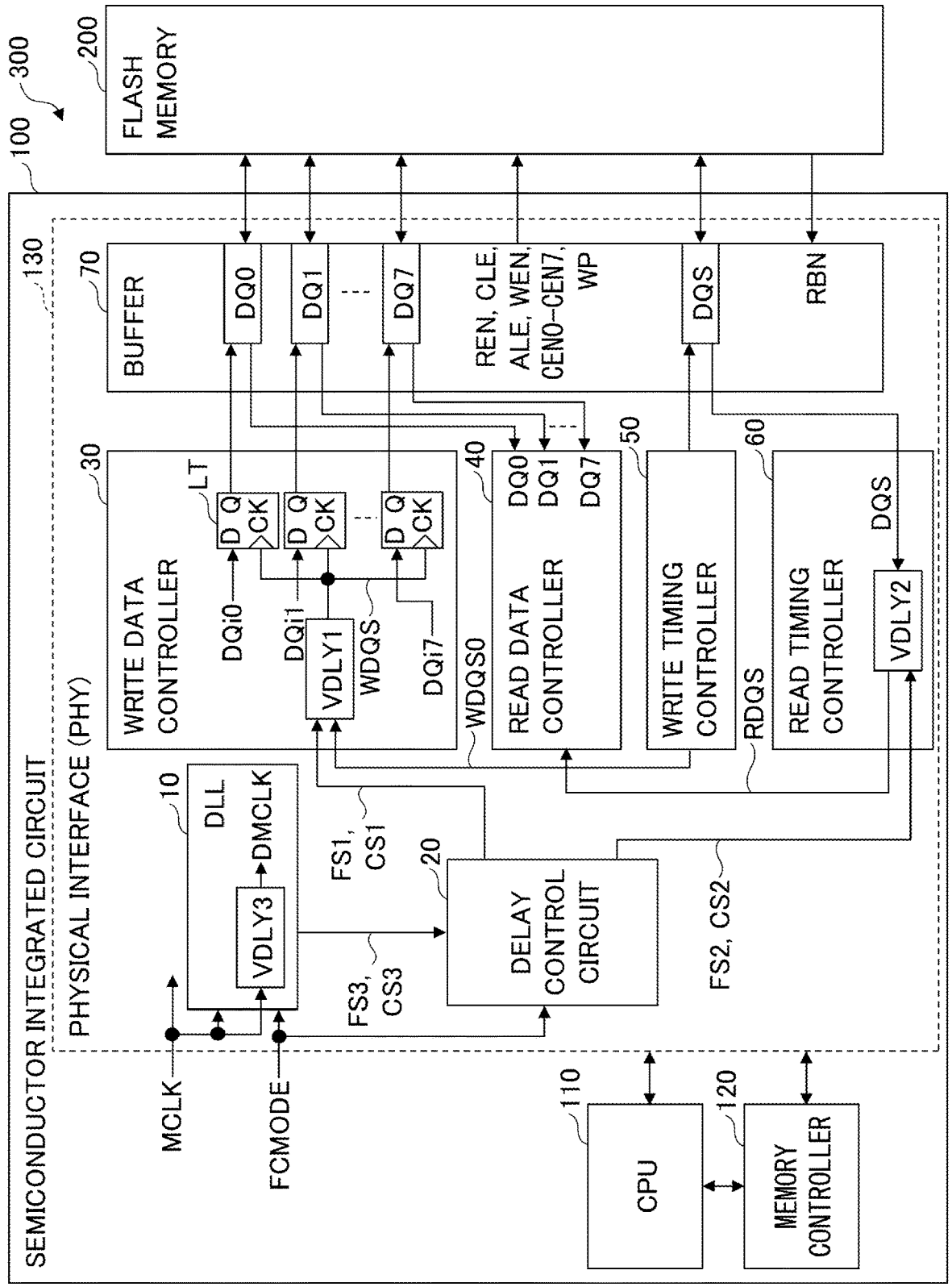
FIG. 1 is a diagram illustrating a configuration of a semiconductor integrated circuit according to a first embodiment.

With the disclosed technique, in a variable delay circuit that can adjust a wide range of delay amount, the accuracy in adjusting the delay amount can be improved.

In the following, embodiments will be described with reference to the drawings. A signal and a signal line that transmits the signal are referenced by the same reference numerals.

First Embodiment

FIG. 1 illustrates a configuration of a semiconductor integrated circuit 100 according to a first embodiment. In the first embodiment, the semiconductor integrated circuit 100 is mounted in a system 300 with a memory device, such as a flash memory 200. For example, the semiconductor integrated circuit 100 is a system on a chip (SoC). The flash memory 200 is of the NAND type, for example, and can change the operating frequency depending on an operation mode. The semiconductor integrated circuit 100 and the flash memory 200 are mounted on a system substrate, and wiring on the system substrate interconnects the semiconductor integrated circuit 100 and the flash memory 200.

Here, the semiconductor integrated circuit 100 may connect a device other than the flash memory 200.

The semiconductor integrated circuit 100 includes a central processing unit (CPU) 110, a memory controller 120, and a physical interface (PHY) 130. The CPU 110 controls various circuits (including the memory controller 120 and the physical interface 130) mounted in the semiconductor integrated circuit 100. The memory controller 120 controls an access to the flash memory 200 based on an instruction from the CPU 110.

The physical interface 130 includes a delayed-locked loop (DLL) circuit 10, a delay control circuit 20, a write data controller 30, a read data controller 40, a write timing controller 50, a read timing controller 60, and a buffer 70. The physical interface 130 generates a signal supplied to the flash memory 200 based on a clock signal MCLK, which will be described later, and receives a signal output by the flash memory 200. The physical interface 130 is an example of an interface that receives a signal from the flash memory 200 and outputs a signal to the flash memory 200.

The DLL circuit 10 includes a variable delay circuit VDLY3 that delays the clock signal MCLK to generate a delay clock signal DMCLK, and performs an operation to match a phase of the clock signal MCLK with a phase of the delay clock signal DMCLK. The clock signal MCLK is a reference clock for controlling the access to the flash memory 200 and is set to a frequency the same as the operating frequency of the flash memory 200. For example, the clock signal MCLK is generated by dividing the frequency of a clock signal used in the semiconductor integrated circuit 100. The variable delay circuit VDLY3 is an example of a second variable delay circuit.

The DLL circuit 10 adjust a delay time duration of the variable delay circuit VDLY3 by using a control signal FS3 or a control signal CS3 in accordance with a mode signal FCMODE. The mode signal FCMODE is used to identify a mode (a first or second mode) according to the operating frequency of the flash memory 200. The DLL circuit 10 outputs the control signals FS3 and CS3 to the delay control circuit 20. The operation of the variable delay circuit VDLY3 based on the control signals FS3 and CS3 will be described in FIG. 3, and the operation mode will be described in FIG. 8.

The delay control circuit 20 generates control signals FS1, CS1, FS2, and CS2 based on the mode signal FCMODE and the control signals FS3 and CS3. The control signals FS1 and CS1 are used to adjust a delay time duration of a variable delay circuit VDLY1 of the write data controller 30. The control signals FS2 and CS2 are used to adjust the delay time duration of the variable delay circuit VDLY2 of the read timing controller 60.

The write data controller 30 operates in a write cycle to write data to the flash memory 200. The write data controller 30 includes the variable delay circuit VDLY1 and latch circuits LT corresponding to data signals DQ (DQ0-DQ7; write data). Here, the number of bits of the data signal DQ is not limited to 8 bits. The variable delay circuit VDLY1 is an example of a first variable delay circuit.

The variable delay circuit VDLY1 generates a delay write timing signal WDQS obtained by delaying a write timing signal WDQS0, based on the control signals FS1 and CS1 from the delay control circuit 20. Each of the latch circuits LT latches a corresponding data signal DQi (DQi0 to DQi7) in synchronization with the delay write timing signal WDQS and outputs the latched data signal DQi as the data signal DQ to the buffer 70. An example of the operation of the write data controller 30 will be described in FIG. 2.

The read data controller 40 operates in a read cycle to read data from the flash memory 200.

The read data controller 40 receives the data signals DQ (DQ0-DQ7; read data) output from the flash memory 200 through the buffer 70 in synchronization with a delay read timing signal RDQS output from the read timing controller 60.

The write timing controller 50 operates in the write cycle and outputs a data strobe signal DQS to the flash memory 200 through the buffer 70. Additionally, the write timing controller 50 generates, for example, the write timing signal WDQS0 having a phase the same as the phase of the data strobe signal DQS. Here, the phase of the write timing signal WDQS0 may be different from the phase of the data strobe signal DQS. Additionally, the write timing signal WDQS0 may be generated by a circuit other than the write timing controller 50.

The read timing controller 60 operates in the read cycle and includes a variable delay circuit VDLY2. The variable delay circuit VDLY2 generates a delay read timing signal RDQS by shifting the phase of the data strobe signal DQS output by the flash memory 200 together with the read data signal DQ by 90 degrees. Because a delay time duration corresponding to the phase of 90 degrees is different depending on the operating frequency of the flash memory 200, the variable delay circuit VDLY2 operates in response to receiving the control signals FS2 and CS2 indicating the delay time duration corresponding to the phase of 90 degrees of the data strobe signal DQS.

The variable delay circuit VDLY2 generates the delay read timing signal RDQS by delaying the data strobe signal DQS based on the control signals FS2 and CS2. An example of the operation of the read timing controller 60 will be described in FIG. 2. The variable delay circuit VDLY2 is an example of the first variable delay circuit.

The buffer 70 includes an output buffer that outputs a signal to the flash memory 200, an input buffer to which a signal is input from the flash memory 200, and an input/output buffer to which a signal is input from the flash memory 200 and that outputs a signal to the flash memory 200. For example, the buffer 70 outputs a read enable signal REN, a command latch enable signal CLE, an address latch enable signal ALE, a write enable signal WEN, chip enable signals CEN0 to CEN7, and a write protect signal WP to the flash memory 200.

The chip enable signals CEN0 to CEN7 are used to select multiple flash memories 200 connected to the semiconductor integrated circuit 100, and in the present embodiment, up to eight flash memories 200 (chips) can be connected to the semiconductor integrated circuit 100.

A ready/busy signal RBN is input from the flash memory 200. The data signal DQ and the data strobe signal DQS are output to the flash memory 200 in the write cycle and are input from the flash memory 200 in the read cycle.

For example, the flash memory 200 is of a double data rate (DDR) type in which the data signal DQ is input and output in synchronization with rising and falling edges of the data strobe signal DQS. The data strobe signal DQS may be a complementary signal, but only a True signal will be described, to make the description easier.

Figure 2:
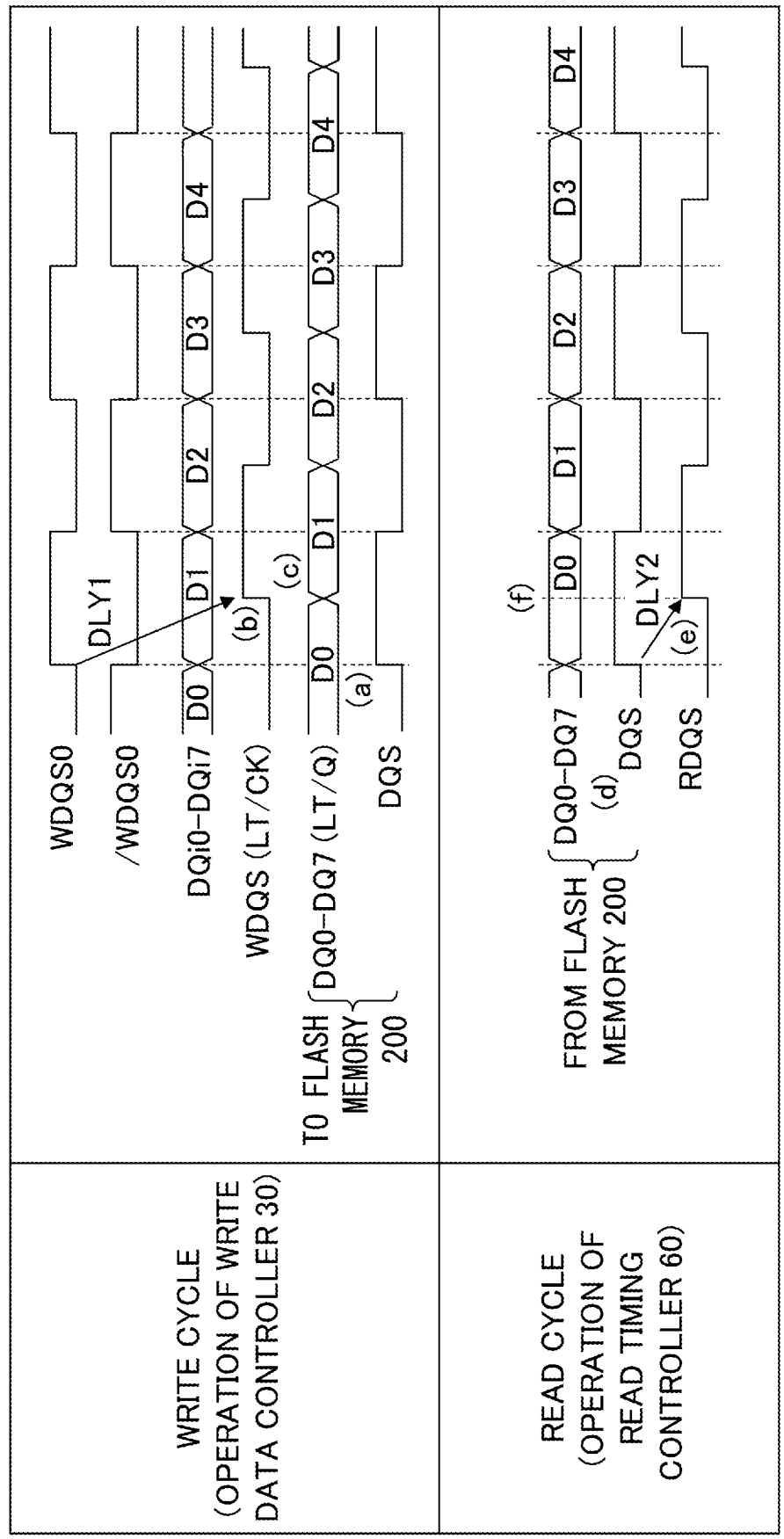
FIG. 2 is a diagram illustrating an operation of a write data controller and a read timing controller.

FIG. 2 illustrates the operation of the write data controller 30 and the read timing controller 60 of FIG. 1.

The semiconductor integrated circuit 100 outputs the data strobe signal DQS, having a transition edge at the center (in the middle between two transition edges) of each of the data signals DQ0-DQ7, to the flash memory 200 in the write cycle for writing data into the flash memory 200 ((a) in FIG. 2). Thus, for example, the write data controller 30 delays the phase of the write timing signal WDQS0, which is equal in phase to the data strobe signal DQS, by 90 degrees, using the variable delay circuit VDLY1 to generate the delay write timing signal WDQS ((b) in FIG. 2).

The variable delay circuit VDLY1 outputs the delay write timing signal WDQS obtained by delaying the write timing signal WDQS0 with a delay amount DLY1, based on the control signals FS1 and CS1 output by the delay control circuit 20 in FIG. 1. The latch circuit LT of the write data controller 30 latches the internal data signals DQi0 to DQi7 in synchronization with the rising edge of the delay write timing signal WDQS and outputs them as data signals DQ0-DQ7 ((c) in FIG. 2), for example. This allows the center of each of the data signals DQ0-DQ7 (the write data) to be aligned with a corresponding transition edge of the data strobe signal DQS in the write cycle. Here, D0, D1, D2, D3, and D4 additionally illustrated on the internal data signals DQi0 to DQi7 and the data signals DQ0-DQ7 indicate data values, and a write timing signal/WDQS0 indicates a signal in which the phase is reversed with respect to the write timing signal WDQS0.

The semiconductor integrated circuit 100 receives the data strobe signal DQS and the data signals DQ0-DQ7 that have the same phase from the flash memory 200 in the read cycle of reading data from the flash memory 200 ((d) in FIG. 2). In other words, the flash memory 200 outputs the data signals DQ0-DQ7 (the read data) in synchronization with the data strobe signal DQS.

The semiconductor integrated circuit 100 delays the phase of the data strobe signal DQS by 90° by using the variable delay circuit VDLY2 to generate a delay read timing signal RDQS having a transition edge at the center of each of the read data signals DQ0-DQ7 (in the middle of the transition edges) ((e) in FIG. 2). The variable delay circuit VDLY2 outputs the delay read timing signal RDQS obtained by delaying the data strobe signal DQS with a delay amount DLY2 based on the control signals FS2 and CS2 output by the delay control circuit 20 in FIG. 1.

The read data controller 40 receives the data signals DQ0-DQ7 received from the flash memory 200 in synchronization with the delay read timing signal RDQS ((f) in FIG. 2). This allows the center of each of the data signals DQ0-DQ7 (the read data) to be aligned with a corresponding transition edge of the data strobe signal DQS in the read cycle.

Figure 3:
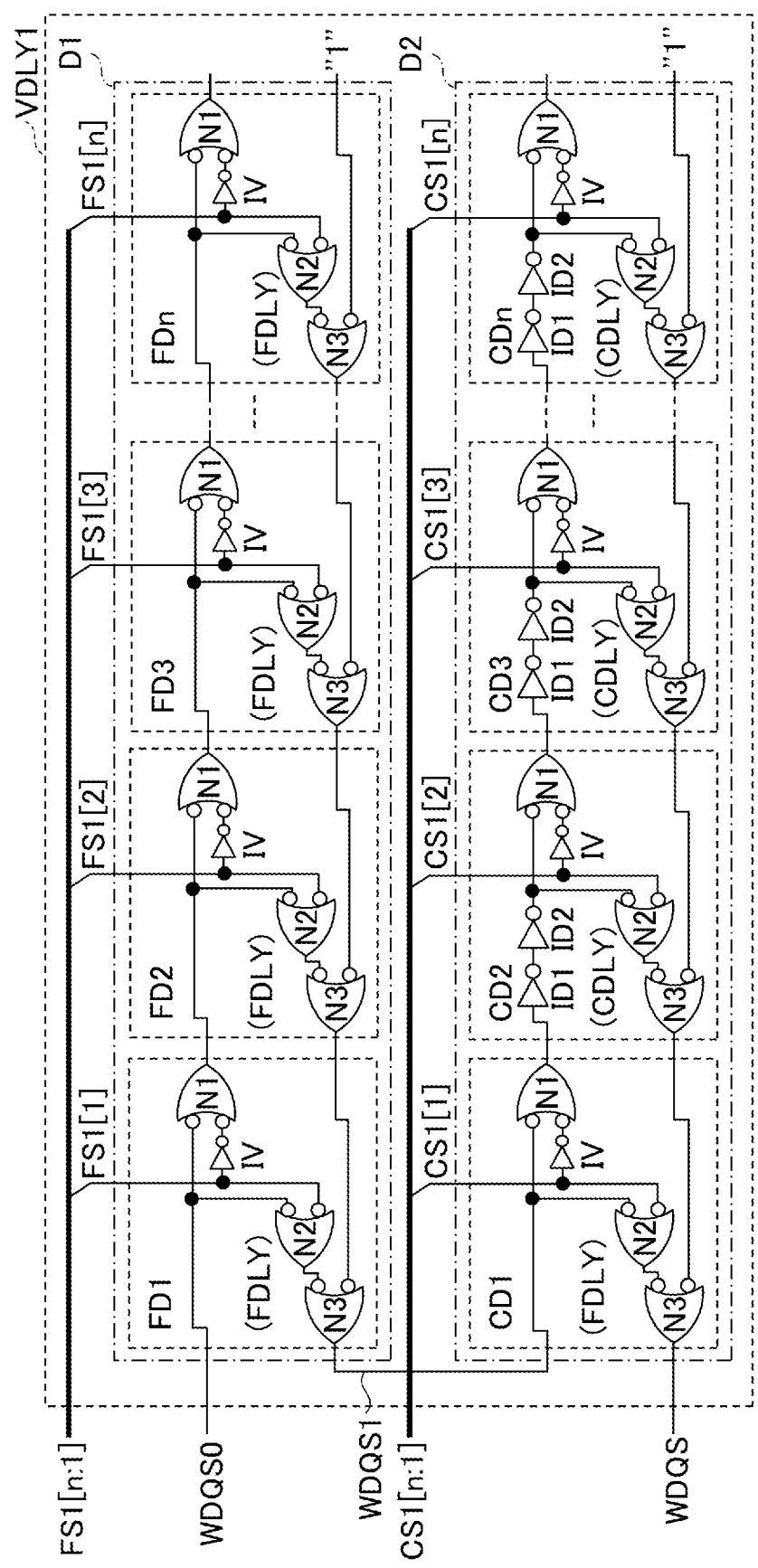
FIG. 3 is a diagram illustrating a circuit configuration of a variable delay circuit in FIG. 1.

FIG. 3 illustrates a circuit configuration of the variable delay circuit VDLY1 in FIG. 1. The circuit configurations of the variable delay circuits VDLY2 and VDLY3 illustrated in FIG. 1 are identical to the configuration of the variable delay circuit VDLY1, for example.

The variable delay circuit VDLY1 includes a delay line D1 that operates based on an n-bit control signal FS1[n:1] and a delay line D2 that operates based on an n-bit control signal CS1[n:1]. Here, the delay line D1 may be connected subsequent to the delay line D2, rather than prior to the delay line D2. The delay line D1 is an example of a first delay circuit, and the delay line D2 is an example of a second delay circuit.

The delay line D1 includes n (for example, 128) delay elements FD (FD1-FDn) connected in series that operate in accordance with respective bit values of the control signal FS1[n:1]. The delay line D2 includes n delay elements CD (CD1-CDn) connected in series that operate according to respective bit values of the control signal FS2[n:1].

The delay elements FD1-FDn are examples of first delay elements, the delay element CD1 is an example of a second delay element, and the delay elements CD2-CDn are examples of a third delay element. The control signal FS1[n:1] is an example of a first control signal, and the control signal FS2[n:1] is an example of a second control signal.

Because the delay elements FD1-FDn and the delay element CD1 have the same circuit configuration, the delay element FD1, which is a first stage of the delay line D1, will be described below. Additionally, because the delay elements CD2-CDn have the same circuit configuration, the delay element CD2 will be described below.

In the drawing, the symbol "FDLY" (Fine Delay) is additionally illustrated on each of the delay elements FD1-FDn and the delay element CD1 to indicate that the delay time durations are identical to each other. In the drawing, the symbol "CDLY" (Coarse Delay) is additionally illustrated on each of the delay elements CD2-CDn to indicate that the delay time durations are identical to each other. The delay time duration of the delay element "FDLY" is shorter than the delay time duration of the delay element "CDLY". In the following description, the left side of the delay element FD of interest or the delay element CD of interest is also referred to as the input side, and the right side of the delay element FD of interest or the delay element CD of interest is also referred to as the output side.

The delay element FD1 includes NAND gates N1, N2, and N3 and an inverter IV that inverts the logic of the control signal FS1[1]. The NAND gate N1 receives a signal obtained by inverting the logic of the control signal FS1[1] with the inverter IV and an input signal. In the delay element FD1, which is the first stage, the input signal is the write timing signal WDQS0. If the control signal FS1[1] is logic 0, the NAND gate N1 inverts the logic of the input signal and outputs the inverted input signal to the delay element FD2 on the output side. If the control signal FS1[1] is logic 1, the NAND gate N1 outputs logic 1 to the delay element FD2 on the output side.

If the control signal FS1[1] is logic 1, the NAND gate N2 inverts the logic of the input signal and outputs the inverted input signal to the NAND gate N3. If the control signal FS1[1] is logic 0, the NAND gate N2 outputs logic 1 to the NAND gate N3. If either the logic of the output of the NAND gate N2 or the logic of the output of the NAND gate N3 of the delay element FD2 that is adjacent on the output side is logic 0, the NAND gate N3 outputs logic 1. If both the logic of the output of the NAND gate N2 and the logic of the output of the NAND gate N3 of the delay element FD2 that is adjacent on the output side are logic 1, the NAND gate N3 outputs logic 0.

If the delay line D1 delays the write timing signal WDQS0, the delay control circuit 20 illustrated in FIG. 1 sets two consecutive bits of the n-bit control signal FS1[n:1] to logic 1, and sets the remaining bits of the control signal FS1 to logic 0. With this setting, the delay element FD that receives the control signal FS1 having a smaller bit number among the two control signals FS1 that are set to logic 1 returns a signal received from the input side and outputs the signal from the NAND gate N3 to the input side. In the following, a delay element FD (or CD) that returns a signal is also referred to as a return delay element, and a state of the return delay element is referred to as a return state. Here, if the delay element FDn, which is the final stage of the delay line D1, is set to the return state, only the control signal FS1[n] is set to logic 1, and the other bits of the control signal FS1 are set to logic 0.

The NAND gate N1 of the return delay element FD outputs logic 1. The NAND gate N3 of the delay element FD that receives the control signal FS1 having a smaller bit number among the two control signals FS1 that are set to logic 1 receives a signal (logic 0) obtained by inverting logic 1 of the control signal FS1 with the inverter IV and outputs logic 1. In the following, a delay element FD (or CD) connected to the output side of the return delay element FD (or CD) is also referred to as a return control element.

The NAND gate N1 of the delay element FD on the input side of the return delay element FD functions as an inverter that receives a signal obtained by inverting logic 0 of the control signal FS1 and that inverts the logic of the input signal and outputs the inverted input signal. The NAND gate N3 of the delay element FD on the input side of the return delay element FD receives a signal of logic 1 output by the NAND gate N2 based on the control signal FS1 of logic 0. Thus, the NAND gate N3 of the delay element FD on the input side of the return delay element FD functions as an inverter that inverts the logic of the signal output by the NAND gate N3 of the delay element FD adjacent on the output side and outputs the inverted signal.

As described above, the delay element FD located on the input side of the return delay element FD transfers the signal received from the input side to the output side and transfers the signal received from the output side to the input side. In the following, a delay element FD (or CD) that is located on the input side from the return delay element FD (or CD) and that receives the control signal FS (or CD) of logic 0 is also referred to as a transfer delay element, and a state of the transfer delay element is also referred to as a transfer state. Here, if the delay element FD1 (or CD1), which is the first stage, is set to the return state, the transfer delay element does not exist.

With the above-described operation, the delay line D1 delays the write timing signal WDQS0 received by the delay element FD1, which is the first stage, with a predetermined number of delay elements FD, and outputs the delayed signal as a delay signal WDQS1 from the delay element FD1, which is the first stage. Here, the delay line D1 delays a signal through an even number of NAND gates connected in series and outputs the delayed signal. A selector is not provided in the delay line D1 and the signal is delayed by an even number of NAND gates, thereby preventing the duty ratio of the output signal (the delayed signal) from changing from the duty ratio of the input signal. Additionally, the duty ratio can be constant regardless of the number of stages of the delay elements FD that are used.

Each of the delay elements CD2-CDn has the same configuration as the delay element FD1 except that delay inverters ID1 and ID2 are added to the delay element FD1. The delay inverters ID1 and ID2 are inverters connected in series between an input terminal connected to the delay element CD on the input side and the NAND gate N1, and function as delay elements. Each of the delay elements CD2-CDn supplies a signal delayed by the delay inverters ID1 and ID2 to the NAND gates N1 and N2.

The delay time duration of each of the delay elements CD2-CDn is longer than the delay time duration of the delay element FD1 for the delay time duration of the delay inverters ID1 and ID2. For example, the delay time duration of each of the delay elements CD2-CDn may be set to be four times longer than the delay time duration of the delay element FD1 or an integer multiple greater than or equal to two. By setting the delay time duration of each of the delay elements CD2-CDn to an integer multiple of the delay element FD1, the delay time duration can be easily calculated regardless of the delay element (FD or CD) used to delay the signal, and the number of the delay elements that are used can be easily calculated. The delay time duration of the delay elements FD1-FDn and CD1 is an example of a first delay time duration, and the delay time duration of the delay elements CD2-CDn is an example of a second delay time duration.

In the delay line D2, among the two delay elements CDs that are adjacent to each other and that receive the control signal CS1 of logic 1, the delay element CD located on the input side is set to the return state to function as the return delay element CD. The delay element CD located on the input side of the return delay element CD is set to the transfer state to function as the transfer delay element. The delay element CD located on the output side of the return delay element CD functions as the return control element. Here, if the delay element CDn, which is the last stage of the delay line D2, is set to the return state, only the control signal CS1[n] is set to logic 1.

The delay line D2 delays the delay signal WDQS1 received by the delay element CD1, which is the first stage, with a predetermined number of delay elements CD and outputs the delayed signal as the delay write timing signal WDQS from the delay element CD1, which is the first stage. The delay line D2 delays a signal through an even number of NAND gates connected in series and an even number of delay inverters ID1 and ID2 and outputs the delayed signal. This prevents the duty ratio of the output signal (the delayed signal) from changing from the duty ratio of the input signal, as in the delay line D1. Additionally, the duty ratio can be constant regardless of the number of stages of the delay elements CD that are used.

Here, the variable delay circuit VDLY2 receives control signals FS2[n:1] and CS2[n:1] instead of the control signals FS1[n:1] and CS1[n:1] of FIG. 3. Additionally, the variable delay circuit VDLY2 receives the data strobe signal DQS instead of the write timing signal WDQS0 and outputs the delay read timing signal RDQS instead of the delay write timing signal WDQS.

Similarly, the variable delay circuit VDLY3 receives control signals FS3[n:1] and CS3[n:1] instead of the control signals FS1[n:1] and CS1[n:1] of FIG. 3. Additionally, the variable delay circuit VDLY3 receives the clock signal MCLK instead of the write timing signal WDQS0 and outputs the delay clock signal DMCLK instead of the delay write timing signal WDQS.

Here, the connection order of the delay lines D1 and D2 may be reversed. In this case, the delay line D2 outputs the delay signal WDQS1 obtained by delaying the write timing signal WDQS0 for a predetermined time, and the delay line D1 outputs the delay write timing signal WDQS obtained by delaying the delay signal WDQS1 for a predetermined time.

Figure 4:
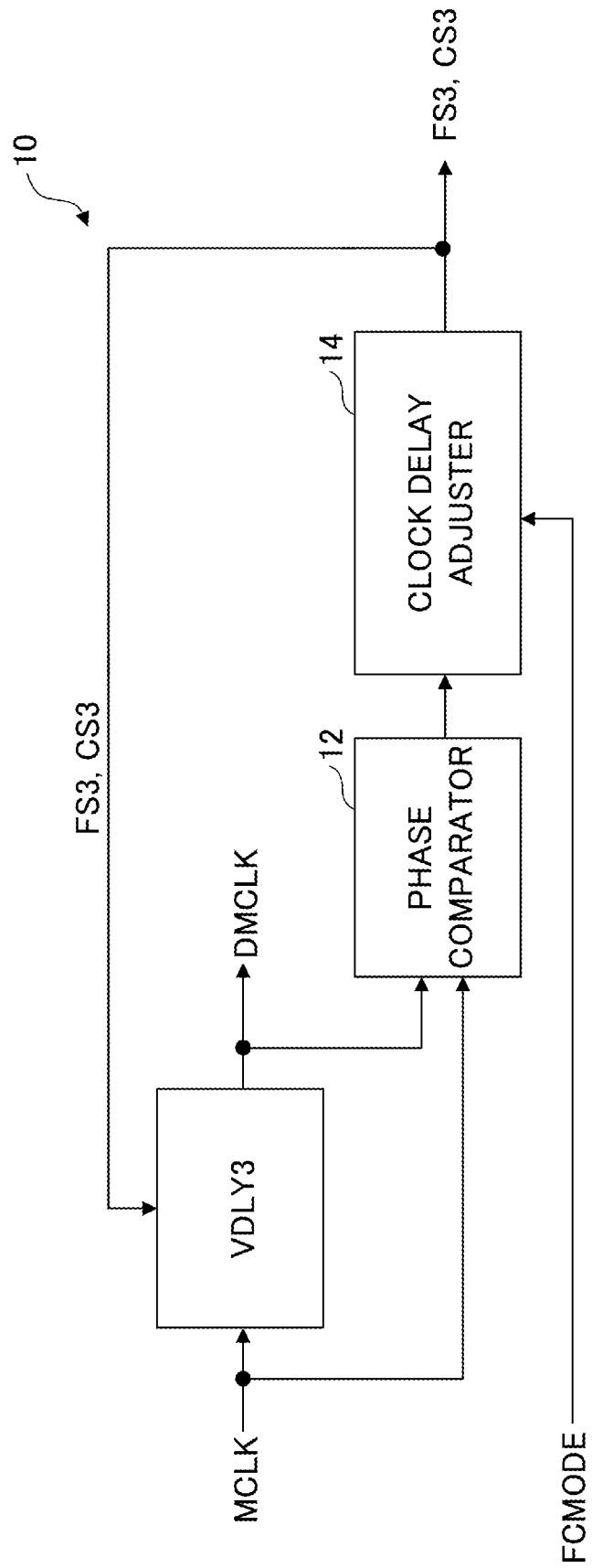
FIG. 4 is a diagram illustrating a configuration of a DLL circuit in FIG. 1.

FIG. 4 illustrates a configuration of the DLL circuit 10 of FIG. 1. The DLL circuit 10 includes the variable delay circuit VDLY3, a phase comparator 12, and a clock delay adjuster 14. For example, the variable delay circuit VDLY3 has the same circuit configuration as the variable delay circuit VDLY1 described with respect to FIG. 3, and delays the clock signal MCLK received as an input to output the delayed signal as the delay clock signal DMCLK.

The phase comparator 12 compares a phase of the clock signal MCLK and a phase of the delay clock signal DMCLK, and outputs a comparison result (information indicating the shift amount of the phases) to the clock delay adjuster 14. The clock delay adjuster 14 outputs the control signals FS3 and CS3 for matching the phase of the delay clock signal DMCLK with the phase of the clock signal MCLK based on the comparison result of the phases. The control signals FS3 and CS3 are practically n-bit signals FS3[n:1] and CS3[n:1].

Here, if the mode signal FCMODE indicates the first mode, the clock delay adjuster 14 adjusts the delay amount of the variable delay circuit VDLY3 by using the delay element FD (FIG. 3) by changing the control signal FS3 without changing the control signal CS3. If the mode signal FCMODE indicates the second mode, the clock delay adjuster 14 adjusts the delay amount of the variable delay circuit VDLY3 by using the delay element CD (FIG. 3) by changing the control signal CS3 without changing the control signal FS3. Examples of the operations of the first mode and the second mode will be described with reference to FIG. 5 and FIG. 6.

In the DLL circuit 10, by matching the phase of the clock signal MCLK with the delay clock signal DMCLK, the period of the clock signal MCLK can be represented as the number of delay stages of the delay elements FD or the number of delay stages of the delay elements CD. In the first mode, the clock delay adjuster 14 outputs the control signal FS3 to the delay control circuit 20 as information indicating the period (i.e., the operating frequency) of the clock signal MCLK. In the second mode, the clock delay adjuster 14 outputs the control signal CS3 to the delay control circuit 20 as the information indicating the period (i.e., the operating frequency) of the clock signal MCLK.

Figure 5:
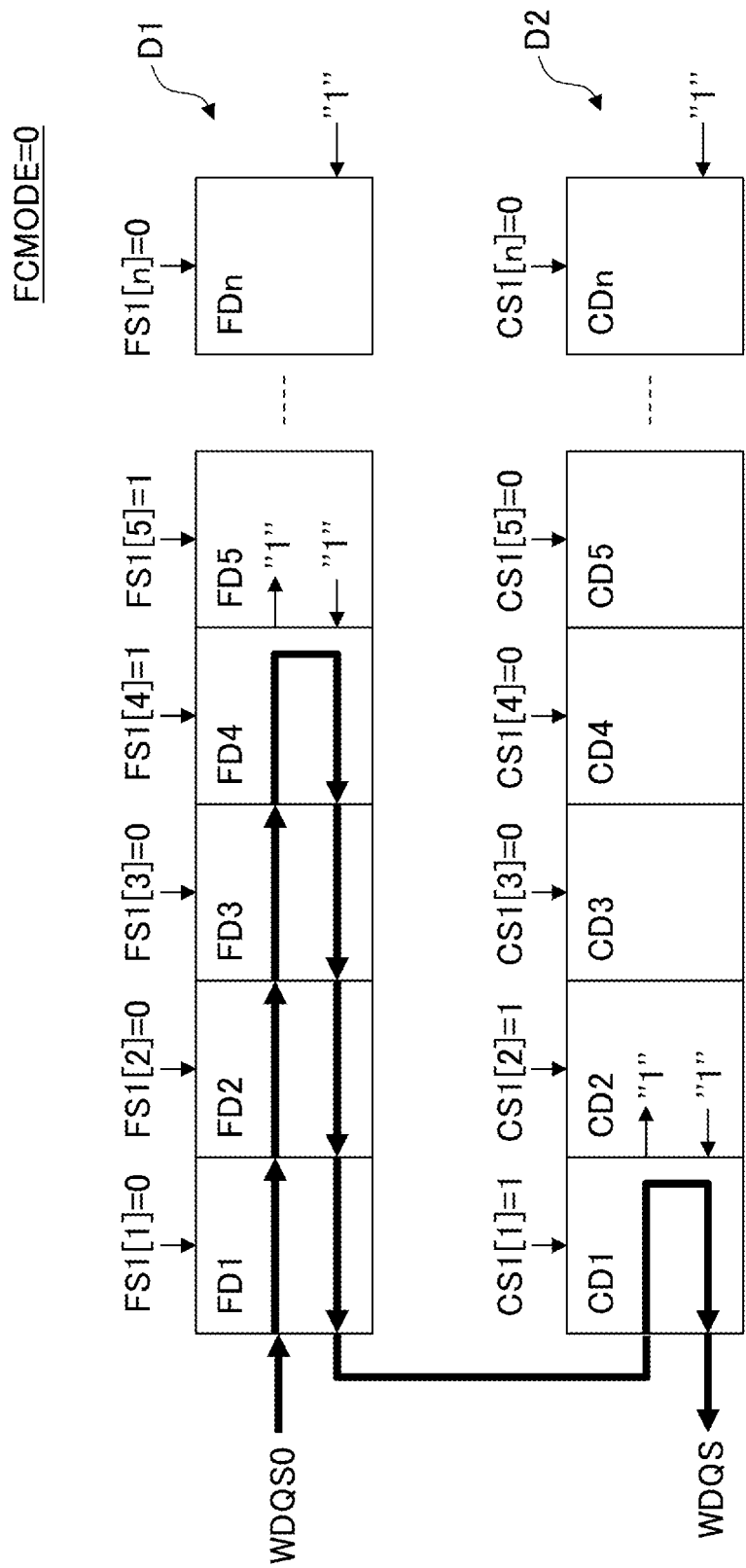
FIG. 5 is a diagram illustrating an example of an operation of the variable delay circuit in FIG. 3.

FIG. 5 illustrates an example of the operation of the variable delay circuit VDLY1 in FIG. 3. Here, the operation of the variable delay circuit VDLY2 is represented by respectively replacing the control signals FS1 and CS1 with control signals FS2 and CS2. Additionally, the operation of the variation delay circuit VDLY2 is represented by respectively replacing the write timing signal WDQS0 and the delay write timing signal WDQS with the data strobe signal DQS and the delay read timing signal RDQS. The operation of the variable delay circuit VDLY3 is represented by respectively replacing the control signals FS1 and CS1 with the control signals FS3 and CS3.

Additionally, the operation of the variable delay circuit VDLY3 is represented by respectively replacing the write timing signal WDQS0 and the delay write timing signal WDQS with the clock signal MCLK and the delay clock signal DMCLK.

FIG. 5 shows an operation of the first mode in which the delay control circuit 20 changes only the control signal FS to adjust the delay time duration of the variable delay circuit VDLY1. The first mode is used when the operating frequency of the flash memory 200 is relatively high, and is indicated by a mode signal FCMODE of logic 0.

In the example illustrated in FIG. 5, the delay elements FD1-FD3 function as the transfer delay elements, the delay element FD4 functions as the return delay elements, and the delay element FD5 functions as the return control element. Here, in the first mode, the delay element CD1, which is the first stage of the delay line D2, functions as the return delay element, and the delay elements CD2-CDn having the delay time duration longer than the delay time duration of the delay element FD are not used.

Therefore, the minimum delay time duration of the variable delay circuit VDLY1 is a time duration for two elements of the delay element FD1 of the delay line D1 and the delay element CD1 of the delay line D2. For example, if the delay time durations of the delay element FD1 and the delay element CD1 are 30 ps, the minimum delay time duration of the variable delay circuit VDLY1 is 60 ps. Here, the delay time duration of each of the delay elements CD2-CDn is, for example, 120 ps. Additionally, examples of the delay time durations of each delay element FD and each delay element CD when the semiconductor integrated circuit 100 is manufactured under standard manufacturing conditions are described.

With respect to the above, if the delay element CD2 is disposed at the first stage of the delay line D2, the minimum delay time duration of the variable delay circuit VDLY1 is 150 ps (30 ps+120 ps), so that the delay time duration cannot be adjusted to be less than 150 ps. In other words, in the present embodiment, when the delay elements FD1-FDn having a relatively small delay amount and the delay elements CD2-CDn having a relatively large delay amount are used to delay the signal, the minimum delay time duration can be less than or equal to the delay time duration of the delay element CD2. Therefore, the variable delay circuit VDLY1 can output a signal having a desired delay amount even when the operating frequency of the flash memory 200 is high. As a result, the delay elements FD1-FDn having a relatively small delay amount and the delay elements CD2-CDn having a relatively large delay amount can be used to improve the adjustment accuracy of the delay amount in the variable delay circuit VDLY1 that can adjust a wide range of the delay amount. These effects can also be obtained with the variable delay circuits VDLY2 and VDLY3.

The example illustrated in FIG. 5 indicates that four delay elements FD1-FD4 and one delay element CD1 are used to delay the write timing signal WDQS0 for 150 ps. In the first mode, because only the control signal FS1 is used to adjust the delay amount of the variable delay circuit VDLY1, the grain size, which is the change amount of the delay amount, always becomes 30 ps. At this time, it is not required to change the logic of the control signal CS1[n:1], but it is required to change only the control signal FS1 set to logic 1.

With respect to the above, if the delay amount is adjusted in units of 30 ps by using both the control signals FS1 and CS1, three delay elements FD are required to be deleted and the delay element CD2 is required to be added, for example. This complicates the logic of the circuit that generates the control signals FS1 and CS1. In other words, in the present embodiment, the logic of the circuit that generates the control signals FS1 and CS1 can be simplified by exclusively using the delay line D1 or the delay line D2 to adjust the delay time.

Figure 6:
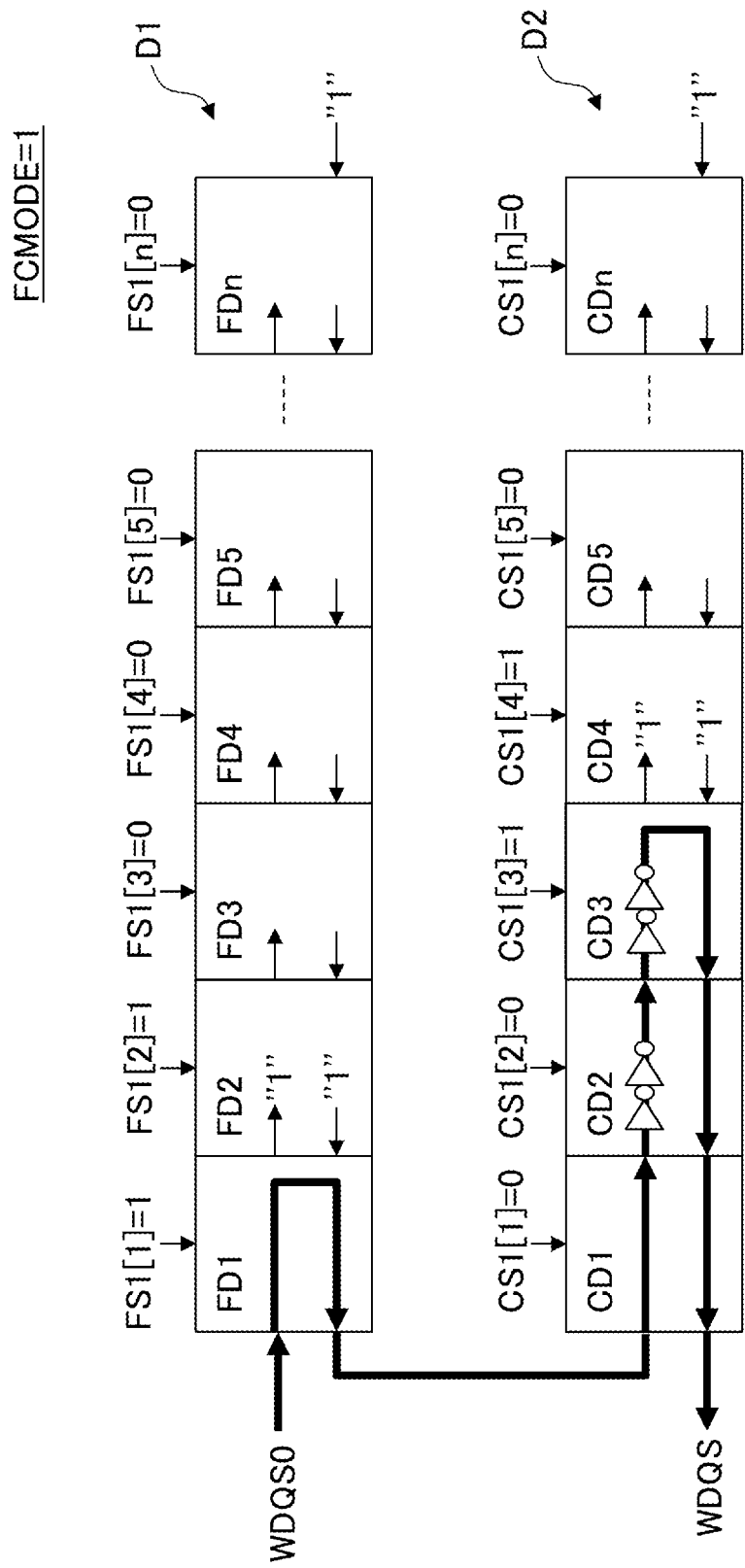
FIG. 6 illustrates another example of the operation of the variable delay circuit in FIG. 3.

FIG. 6 illustrates another example of the operation of the variable delay circuit VDLY1 in FIG. 3. Also in FIG. 6, as described with reference to FIG. 5, the operation of the variable delay circuit VDLY1 can be the operations of the variable delay circuits VDLY2 and VDLY3 by replacing the signal name.

FIG. 6 illustrates the operation of the second mode in which the delay control circuit 20 changes only the control signal CS to adjust the delay time duration of the variable delay circuit VDLY1. The second mode is used when the operating frequency of the flash memory 200 is relatively low, and is indicated by the mode signal FCMODE of logic 1.

In FIG. 6, the delay elements CD1 and CD2 function as the transfer delay elements, the delay element FD3 functions as the return delay element, and the delay element CD4 functions as the return control element. Here, in the second mode, the delay element FD1, which is the first stage of the delay line D1, functions as the return delay element, and the delay elements FD2-FDn having a delay time duration shorter than the delay time duration of the delay element CD are not used.

In the example illustrated in FIG. 6, the variable delay circuit VDLY1 uses the delay element FD1 and the delay elements CD1-CD3 to output the delay write timing signal WDQS obtained by delaying the write timing signal WDQS0 for 300 ps. In the second mode, because only the control signal CS1 is used to adjust the delay amount of the variable delay circuit VDLY1, the grain size, which is the change amount of the delay amount, always becomes 120 ps. At this time, it is not required to change the logic of the control signal FS1[n:1], and it is required to change only the control signal CS1 set to logic 1. Therefore, as in FIG. 5, the logic of the circuit that generates the control signals FS1 and CS1 can be simplified in comparison with a case in which the delay amount is adjusted using both of the control signals FS1 and CS1.

FIG. 7 illustrates a waveform of the delay write timing signal WDQS output by the variable delay circuit VDLY1 in FIG. 3. Here, the operation of the variable delay circuit VDLY2 is represented by respectively replacing the control signals FS1 and CS1 with control signals FS2 and CS2.

Additionally, the operation of the variable delay circuit VDLY2 is represented by respectively replacing the write timing signal WDQS0 and the delay write timing signal WDQS with the data strobe signal DQS and the delay read timing signal RDQS.

The operation of the variable delay circuit VDLY3 is represented by respectively replacing the control signals FS1 and CS1 with the control signals FS3 and CS3. Additionally, the operation of the variable delay circuit VDLY3 is represented by respectively replacing the write timing signal WDQS0 and the delay write timing signal WDQS with the clock signal MCLK and the delay clock signal DMCLK.

As described with reference to FIG. 5, in the first mode, only the control signal FS1 set to logic 1 is changed, and the delay amount is changed in units of 30 ps. That is, the minimum delay is 60 ps. With respect to this, in the second mode, only the control signal CS1 set to logic 1 is changed, and the delay amount is changed in units of 120 ps.

Here, for example, if the delay amount is to be set to 180 ps, the delay amount can be set in both the first mode and the second mode. However, in the first mode, six delay elements of the delay elements FD1-FD5 and the delay elements CD1 having a delay time duration of 30 ps are used, and in the second mode, the delay elements FD1 and the delay elements CD1 and CD2 are used.

As the number of delay elements that are used increases, the accuracy of the delay time duration can be improved because error in the delay time duration of each delay element can be averaged.

For example, as the operating frequency of the flash memory 200 increases, the allowable skew (shift of the transition edges) of the data strobe signal DQS and the like becomes smaller. Therefore, in the first mode, only the delay elements FD1-FDn and CD1 are used to delay the signal, so that the accuracy of the delay time duration can be improved in comparison with a case in which the delay elements CD2-CDn are used. Here, the error in the delay time duration of the delay element is caused by a variation in the transistor size or the like generated in a manufacturing process of the semiconductor integrated circuit 100.

FIG. 8 illustrates an explanation of the control of the variable delay circuit VDLY1 performed by the delay control circuit 20 in FIG. 1. The control of the variable delay circuit VDLY2 and VDLY3 is the same as that of FIG. 8. Here, as described above, the delay time durations of each delay element FD and each delay element CD are standard values when the semiconductor integrated circuit 100 is manufactured under standard manufacturing conditions, and it is assumed that there is no change from the standard values.

Mode 9 to Mode 0 illustrated in the operation mode indicate an operation mode of NV-DDR2/DDR3, which is the interface standard of the NAND type flash memory. For example, Mode 9 indicates that a maximum operating frequency of the flash memory 200 is 333 MHz. Because the flash memory 200 operates in the DDR, the maximum transmission rate in Mode 9 is 666 Mbps, and one cycle of the data strobe signal DQS in the toggle mode is about 3003 ps. In this case, 100 stages of the delay elements FD1 of the delay line D1 are used.

Because Mode 9 and Mode 8 can be supported by adjusting the delay time duration with the delay elements FD1 of the delay line D1, the variable delay circuits VDLY1, VDLY2, and VDLY3 are operated in the first mode. Because Mode 7 to Mode 2 can be supported by adjusting the delay time duration with the delay elements of the delay line D2, the variable delay circuits VDLY1, VDLY2, and VDLY3 are operated in the second mode. Here, although the semiconductor integrated circuit 100 does not support Mode 1 and Mode 0, the semiconductor integrated circuit 100 can support Mode 1 and Mode 2 by providing the variable delay circuits VDLY1, VDLY2, and VDLY3 including the 256 stages of the delay elements CD in the semiconductor integrated circuit 100.

Figure 9:
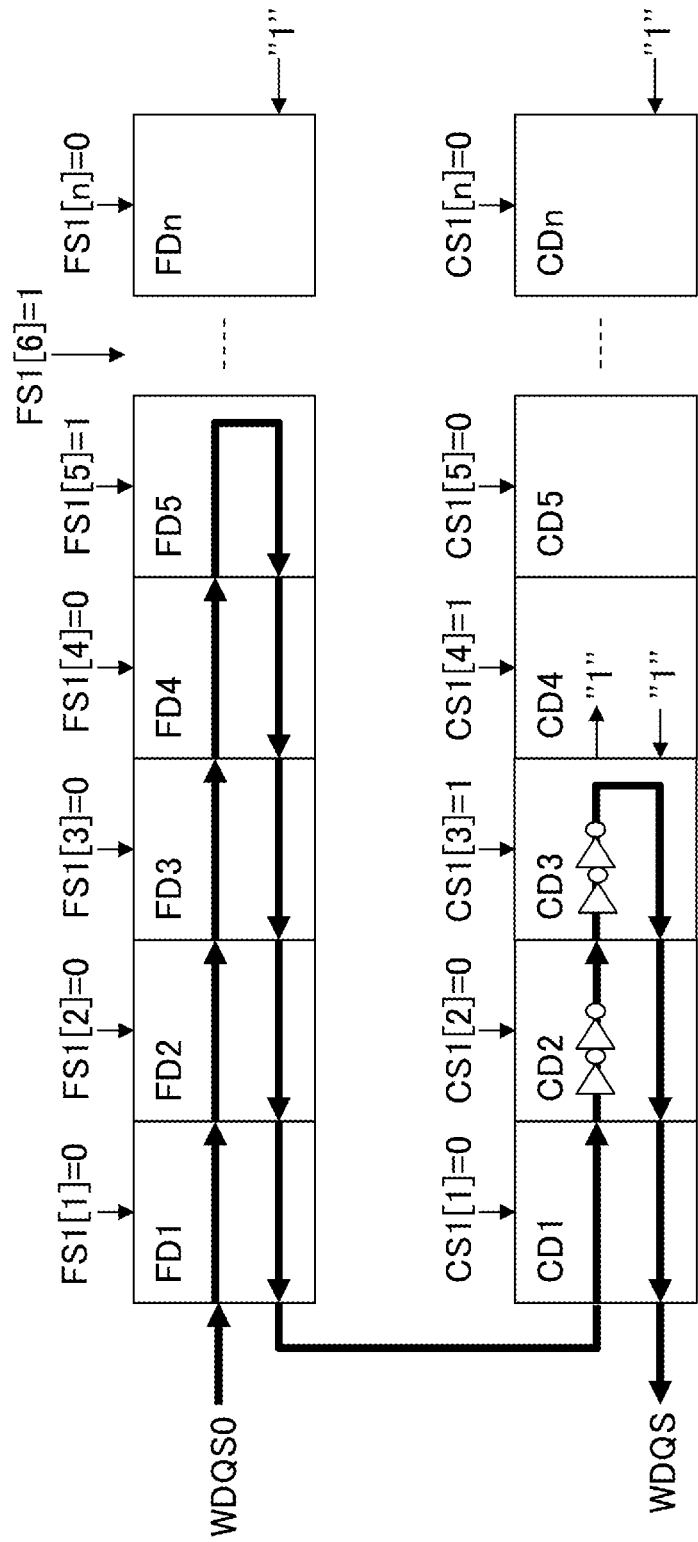
FIG. 9 is a diagram illustrating yet another example of the operation of the variable delay circuit in FIG. 3.

FIG. 9 illustrates yet another example of the operation of the variable delay circuit VDLY1 in FIG. 3. As illustrated in FIG. 9, the semiconductor integrated circuit 100 can adjust the delay time duration of the variable delay circuit VDLY1 by the delay control circuit 20 changing both the control signals FS1 and CS1. FIG. 9 illustrates an example in which five delay elements FD1-FD5 and the delay elements CD1-CD3 are sequentially connected. At this time, the delay time duration of the variable delay circuit VDLY1 is, for example, 420 ps. Here, also in the variable delay circuits VDLY2 and VDLY3, the delay time duration can be adjusted by changing both the control signals FS and CS.

Figure 10:
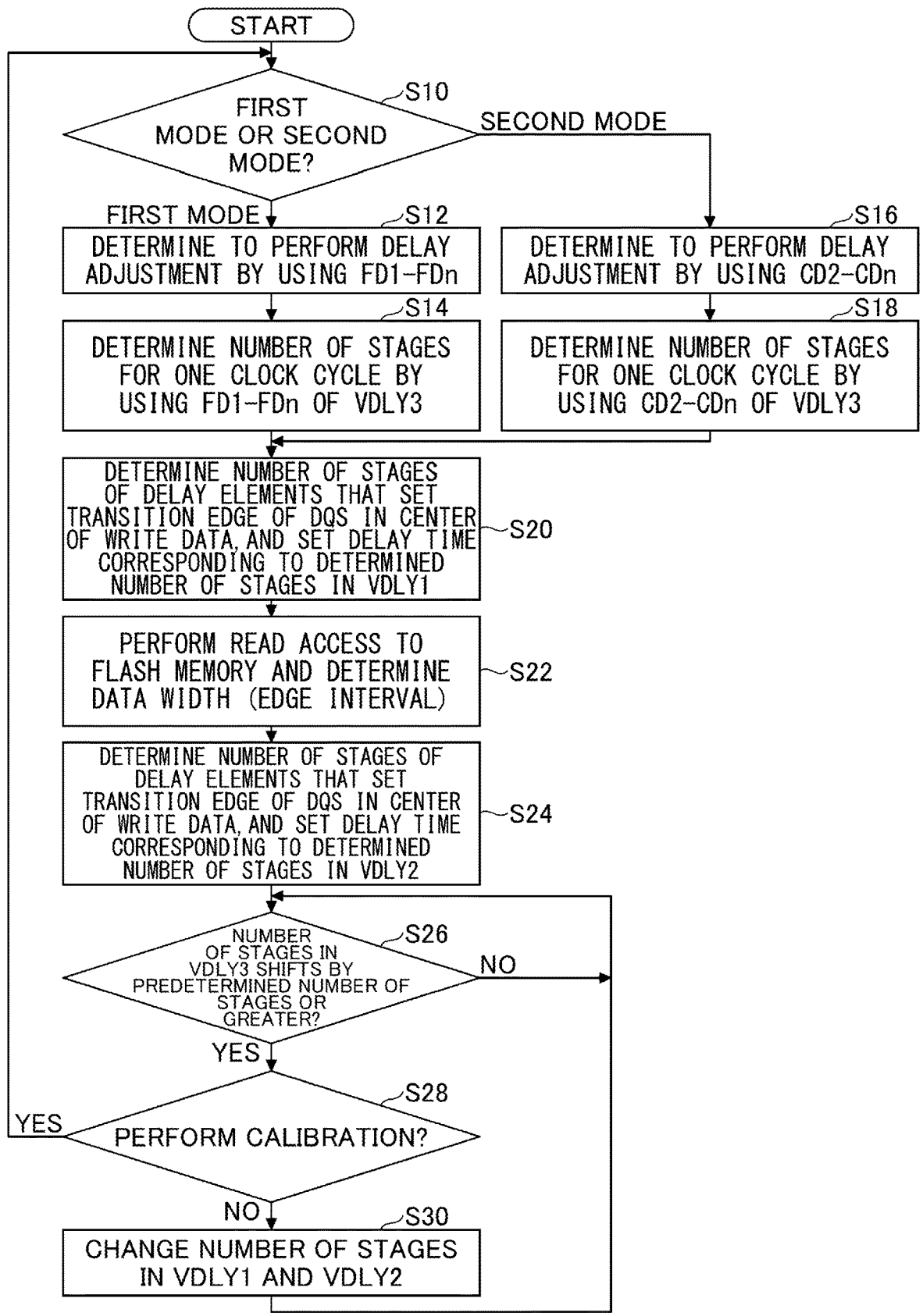
FIG. 10 is a flowchart illustrating a control flow of the variable delay circuit in the semiconductor integrated circuit.

FIG. 10 illustrates a control flow of the variable delay circuits VDLY1, VDLY2, and VDLY3 performed by the semiconductor integrated circuit 100. The control flow illustrated in FIG. 10 may be implemented by a logic circuit or may be implemented by a program executed by a processor such as a CPU mounted in the semiconductor integrated circuit 100.

First, in step S10, the semiconductor integrated circuit 100 determines whether to perform the control in the first mode or in the second mode based on the mode signal FCMODE. If the control is performed in the first mode, in step S12, the semiconductor integrated circuit 100 determines to operate the variable delay circuits VDLY1, VDLY2, and VDLY3 by using the delay elements FD1-FDn. Next, in step S14, the semiconductor integrated circuit 100 uses the delay elements FD1-FDn of the variable delay circuit VDLY3 of the DLL circuit 10 to determine a delay time duration corresponding to one period of the clock signal MCLK as the number of stages of the delay elements FD1-FDn to be used. The delay element CD1 of the delay line D2 can be used in both the first mode and the second mode. Here, the number of stages of the delay elements to be used is determined by a logic level of the control signal FS3.

With respect to the above, if the control is performed in the second mode, in step S16, the semiconductor integrated circuit 100 determines to operate the variable delay circuits VDLY1, VDLY2, and VDLY3 by using the delay element CD2-CDn. Next, in step S18, the semiconductor integrated circuit 100 uses the delay element CD2-CDn of the variable delay circuit VDLY3 of the DLL circuit 10 to determine a delay time duration corresponding to one period of the clock signal MCLK as the number of stages of the delay element CD2-CDn to be used. Here, the delay element FD1 of the delay line D1 is used in both the first mode and the second mode.

After step S14 or step S18, in step S20, the delay control circuit 20 determines the number of stages of the delay elements of the variable delay circuit VDLY1 for setting the transition edge of the data strobe signal DQS to the center of the write data, as illustrated in FIG. 2. In the first mode, the number of stages of the delay elements FD to be used is determined, and in the second mode, the number of stages of the delay elements CD to be used is determined. Then, the delay control circuit 20 outputs, to the variable delay circuit VDLY1, the control signals FS1 and CS1 that set the delay time duration of the variable delay circuit VDLY1 to a delay time duration corresponding to the determined number of stages.

Next, in step S22, the semiconductor integrated circuit 100 performs read access to the flash memory 200 and determines the data width (e.g., the edge interval) of the read data. Next, in step S24, as described with reference to FIG. 2, the delay control circuit 20 determines the number of stages of the delay elements of the variable delay circuit VDLY2 for setting the transition edge of the data strobe signal DQS to the center of the read data. In the first mode, the number of stages of the delay elements FD is determined, and in the second mode, the number of stages of the delay elements CD is determined. Then, the delay control circuit 20 outputs, to the variable delay circuit VDLY2, the control signals FS2 and CS2 that set the delay time duration of the variable delay circuit VDLY2 to a delay time duration corresponding to the determined number of stages.

For example, steps S10 to S24 are performed during a calibration period for correcting the timing of the control signal for accessing the flash memory 200. The calibration is performed when the power supply of the system 300 is started, and is also performed when the semiconductor integrated circuit 100 determines that the calibration is necessary. Here, the calibration may be performed at a predetermined frequency after starting the power supply.

Steps S26 to S30 are performed, for example, during a normal operating duration in which the semiconductor integrated circuit 100 can access the flash memory 200. In step S26, the delay control circuit 20 detects whether the period of the clock signal MCLK has shifted for a predetermined time duration or greater, by detecting whether the number of stages of the delay elements used to generate the delay time duration has shifted by a predetermined number or greater in the variable delay circuit VDLY3.

The semiconductor integrated circuit 100 repeatedly performs step S26 of detecting a shift in the number of stages. In the first mode, the delay control circuit 20 detects a shift in the number of stages based on the change in the logic of the control signal FS3, and in the second mode, the delay control circuit 20 detects a shift in the number of stages based on the change in the logic of the control signal CS3. For example, a shift in the period of the clock signal MCLK is caused by a change in the temperature or power supply voltage of the semiconductor integrated circuit 100.

When the number of stages of the delay element has shifted by the predetermined number of stages or greater, in step S28, the semiconductor integrated circuit 100 determines whether to perform calibration, and if the calibration is performed, the flow proceeds to step S10. For example, when the number of stages of the delay elements has rapidly changed, the delay control circuit 20 notifies a controller of the semiconductor integrated circuit 100, which is not illustrated. The controller that receives the notification determines that the temperature or voltage of the semiconductor integrated circuit 100 has changed rapidly and determines to perform the calibration.

If the calibration is not performed, in step S30, the delay control circuit 20 changes the number of stages of the delay elements of the variable delay circuits VDLY1 and VDLY2 in accordance with the shift amount of the number of stages of the delay elements of the variable delay circuit VDLY3. For example, the delay control circuit 20 changes the logic of the control signals FS1, CS1, FS2, and CS2 in accordance with changes in the logic of the control signals FS3 and CS3. This allows the delay times of the variable delay circuits VDLY1, VDLY2, and VDLY3 to be the same as one another.

For example, the variable delay circuits VDLY1-VDLY3 always operate in the same operation mode. Thus, when logic 1 in the control signal FS3 is changed from FS3[3] and FS3[4] to FS3[4] and FS3[5], the delay control circuit 20 sets the control signals FS1[4] and FS1[5] to logic 1, and sets the control signals FS2[4] and FS2[5] to logic 1. As described above, the delay control circuit 20 can change the delay time duration of the variable delay circuits VDLY1 and VDLY2 by simple control in accordance with the change in the delay time duration of the variable delay circuit VDLY3. The delay control circuit 20 returns the operation to step S26 after step S30.

As described above, in the first embodiment, the delay element CD1 having a small delay amount is disposed at the first stage of the delay line D2 including the delay elements CD2-CDn having a large delay amount. This allows the minimum delay time to be the delay time duration of the delay element CD2 or less, if the delay elements FD1-FDn having a small delay amount and the delay elements CD2-CDn having a large delay amount are used to delay the signal. Thus, the variable delay circuits VDLY1-VDLY3 can output a signal having a desired delay amount even when the operating frequency of the flash memory 200 is high. As a result, the adjustment accuracy of the delay amount can be improved in the variable delay circuits VDLY1-VDLY3 that can adjust a wide range of the delay amount by using the delay elements FD1-FDn having a small delay amount and the delay elements CD2-CDn having a large delay amount.

In the first mode in which the operating frequency of the flash memory 200 is high, the signal is delayed using only the delay elements FD1-FDn and CD1, so that the number of the delay elements that are used can be increased in comparison with the case in which the delay elements CD2-CDn are used. As a result, the accuracy of the delay time duration caused by the variable delay circuit VDLY1-VDLY3 can be improved.

The delay time duration is adjusted by exclusively using the delay line D1 or the delay line D2 of each of the variable delay circuits VDLY1-VDLY3 in accordance with the operation mode, so that the logic of the circuit for generating the control signals FS1 and CS1 can be simplified. Because the variable delay circuits VDLY1-VDLY3 always operate in the same operation mode, the delay time durations of the variable delay circuits VDLY1 and VDLY2 can be adjusted with simple control by using the control signals FS3 and CS3 for adjusting the delay time duration of the variable delay circuits VDLY3.

By setting the delay time duration of each of the delay elements CD2-CDn to an integer multiple of the delay time duration of the delay element FD1, the delay time duration can be easily calculated regardless of the delay element (FD or CD) used to delay the signal, and the number of used delay elements can be easily calculated.

In the delay line D1, by delaying the signal through an even number of NAND gates connected in series, the duty ratio of the output signal (the delayed signal) can be prevented from changing from the duty ratio of the input signal.

Also in the delay line D2, by delaying the signal through an even number of NAND gates connected in series and an even number of delay inverters ID1 and ID2, the duty ratio of the output signal (the delayed signal) can be prevented from changing from the duty ratio of the input signal. Additionally, the duty ratio can be constant regardless of the number of stages of the delay elements FD and CD that are used.

Because an interrupting capacitive element is not disposed on the delay element FD, fine adjustment (trimming and the like) of the delay time duration that changes in accordance with the capacitive value in the delay element FD is not required. This does not require a fine-tuning circuit and prevents the increase in the circuit size of the delay element FD. Additionally, because a capacitive value of the capacitive element of the delay element FD is not required to be adjusted in accordance with the load connected to the output of the delay line D1, the design man-hours can be reduced.

Figure 11:
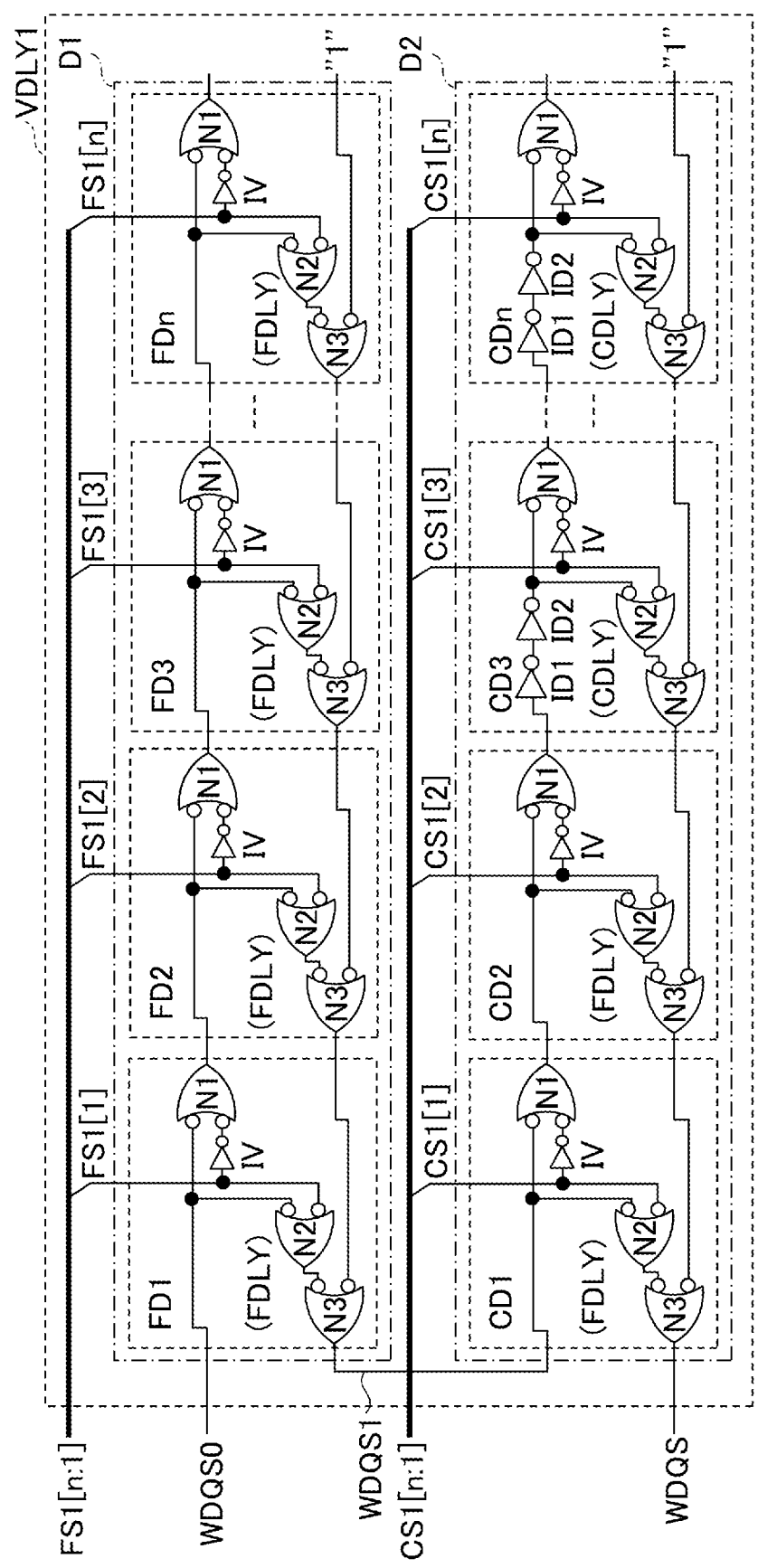
FIG. 11 is a diagram illustrating a circuit configuration of a variable delay circuit according to a second embodiment.

FIG. 11 illustrates a circuit configuration of a variable delay circuit according to a second embodiment. Elements substantially the same as the elements in FIG. 3 are referenced by the same reference numerals, and the detailed description shall be omitted. FIG. 11 illustrates an example of applying the second embodiment to the variable delay circuit VDLY1 illustrated in FIG. 1, but the second embodiment can be applied to the variable delay circuits VDLY2 and VDLY3 illustrated in FIG. 1. In the semiconductor integrated circuit 100, a configuration except for the variable delay circuit VDLY1-VDLY3 is the same as the configuration in FIG. 1. Here, the delay line D1 may be connected subsequent to the delay line D2 rather than prior to the delay line D2.

The variable delay circuit VDLY1 illustrated in FIG. 11 includes the delay line D1 and the delay line D2. The circuit configuration of the delay line D1 is substantially the same as the circuit configuration of FIG. 3. The delay element CD2 of the delay line D2 has the same circuit configuration as the delay element CD1. That is, on the first stage side of the delay line D2, two delay elements CD1 and CD2 having the same delay time as the delay element FD1 are connected in series. The delay element CD2 illustrated in FIG. 11 is an example of the second delay element. The other components of the variable delay circuit VDLY1 are substantially the same as those of the variable delay circuit VDLY1 illustrated in FIG. 3.

In this embodiment, the effect substantially the same as the effect in the first embodiment can be obtained. For example, the delay elements CD1 and CD2 having a smaller delay amount than the delay element "CDLY" are disposed on the first stage side of the delay line D2, so that the minimum delay amount of the variable delay circuits VDLY1-VDLY3 can be less than or equal to the delay time duration of the delay element "CDLY". This enables a signal having a desired delay amount to be output, even when the operating frequency of the flash memory 200 is high, and the adjustment accuracy of the delay amount can be improved in the variable delay circuits VDLY1-VDLY3 that can adjust a wide range of delay amounts.

Further, in this embodiment, as described in FIG. 7, by increasing the number of the delay elements "FDLY" having a relatively short delay time duration, the number of the delay elements "FDLY" that are used can be increased, thereby improving the accuracy of the delay time.

Figure 12:
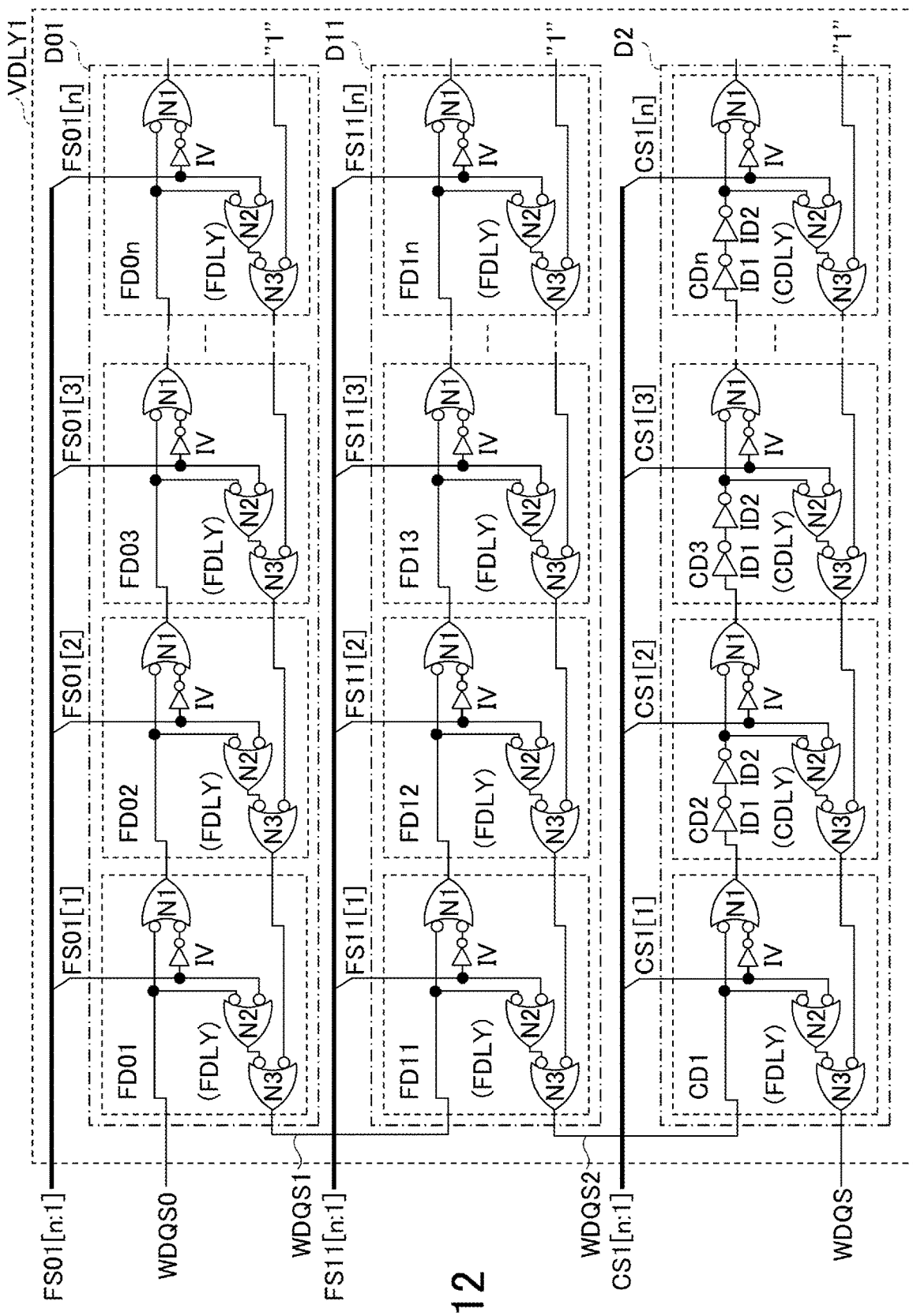
FIG. 12 is a diagram illustrating a circuit configuration of a variable delay circuit according to a third embodiment.

FIG. 12 illustrates a circuit configuration of a variable delay circuit according to a third embodiment. Elements substantially the same as the elements in FIG. 3 are referenced by the same reference numerals, and the detailed description is omitted. FIG. 12 illustrates an example of applying the third embodiment to the variable delay circuit VDLY1 illustrated in FIG. 1, but the third embodiment can be applied to the variable delay circuits VDLY2 and VDLY3 illustrated in FIG. 1. In the semiconductor integrated circuit 100, a configuration except for the variable delay circuits VDLY1-VDLY3 is substantially the same as the configuration in FIG. 1.

The variable delay circuit VDLY1 illustrated in FIG. 12 includes two delay lines D01 and D11 and the delay line D2. The delay lines D01 and D11 and delay lines D2 are connected in this order. The delay lines D01 and D11 each have the same circuit configuration as the delay line D1 illustrated in FIG. 3.

The delay line D01 is controlled by a control signal FS01[n:1], delays the write timing signal WDQS0 for a predetermined time duration, and outputs the delayed signal as the delay signal WDQS1. The delay line D11 is controlled by a control signal FS11[n:1], delays the delay signal WDQS1 for a predetermined time duration, and outputs the delayed signal as a delay signal WDQS2. The delay line D2 is controlled by the control signal CS1[n:1], delays the delay signal WDQS2 for a predetermined time duration, and outputs the delayed signal as the delay write timing signal WDQS.

The delay control circuit 20 in FIG. 1 outputs the control signals FS01[n:1] and FS11[n:1] instead of outputting the control signals FS1[n:1] in FIG. 3. Additionally, the delay control circuit 20 outputs control signals FS02[n:1] and FS12[n:1], which are not illustrated, to the variable delay circuit VDLY2, instead of outputting the control signal FS2[n:1]. The control signals FS02[n:1] and FS12[n:1] are used to adjust the delay time duration of the delay lines D01 and D11 provided in the variable delay circuit VDLY2.

The variable delay circuit VDLY3 in FIG. 1 adjusts the delay time duration of the delay lines D01 and D11 provided in the variable delay circuit VDLY3 by using control signals FS03[n:1] and FS13[n:1], which are not illustrated, instead of the control signal FS3[n:1]. The DLL circuit 10 in FIG. 1 outputs the control signals FS03[n:1] and FS13[n:1] to the delay control circuit 20.

The order of connections of the delay lines D01 and D11 and the delay line D2 is not limited to the order illustrated in FIG. 12. For example, the delay line D2 and the delay lines D01 and D11 may be connected in this order, and the delay line D01, the delay line D2, and the delay line D11 may be connected in this order. Additionally, the variable delay circuit VDLY1 may include two or more delay lines D11. In this case, the delay elements FD01, FD11, and CD1 at the first stages of the delay lines D01, D11, and D2 are also connected in series.

In this embodiment, the effect substantially the same as the effect of the first embodiment can be also obtained. For example, the delay elements FD11 and CD1 ("FDLY") having a delay amount smaller than the delay amount of the delay element "CDLY" are disposed on the first stage side of the delay lines D11 and D2, so that the minimum delay amounts of the variable delay circuits VDLY1-VDLY3 can be less than or equal to the delay amount of the delay element "CDLY". This enables a signal having a desired delay amount to be output, even when the operating frequency of the flash memory 200 is high, and the adjustment accuracy of the delay amount can be improved in the variable delay circuits VDLY1-VDLY3 that can adjust a wide range of delay amounts.

Further, in this embodiment, by providing the two delay lines D01 and D11, and increasing the number of the delay elements FD1 (FD01, FD11, and the like) having a relatively short delay time duration, the range of the delay time that is adjustable by the delay element FD1 can be expanded.

For example, by providing 128 stages of the delay elements FD in each of the delay lines D01 and D11 of the variable delay circuits VDLY1, VDLY2, and VDLY3, 257 stages of the delay elements "FDLY" including the delay element CD1 can be used. This can expand the range of the operation mode of the flash memory 200 that can be supported in the first mode can be expanded.

The maximum delay time duration obtained by the 257 stages of the delay elements FD and the delay element CD1 is 7710 ps when it is assumed that the delay time duration of one element is 30 ps. In this case, the variable delay circuits VDLY1, VDLY2, and VDLY3 can operate in the first mode from Mode 9 to Mode 5 illustrated in FIG. 8. Therefore, compared with the assignment of the first mode and the second mode illustrated in FIG. 8, the accuracy of the delay time duration can be improved. As a result, for example, the accuracy of the positional relationship between the transition edge of the data strobe signal DQS and the data signal DQ of the flash memory 200 can be improved, and the operating margin of the flash memory 200 can be improved.

Figure 13:
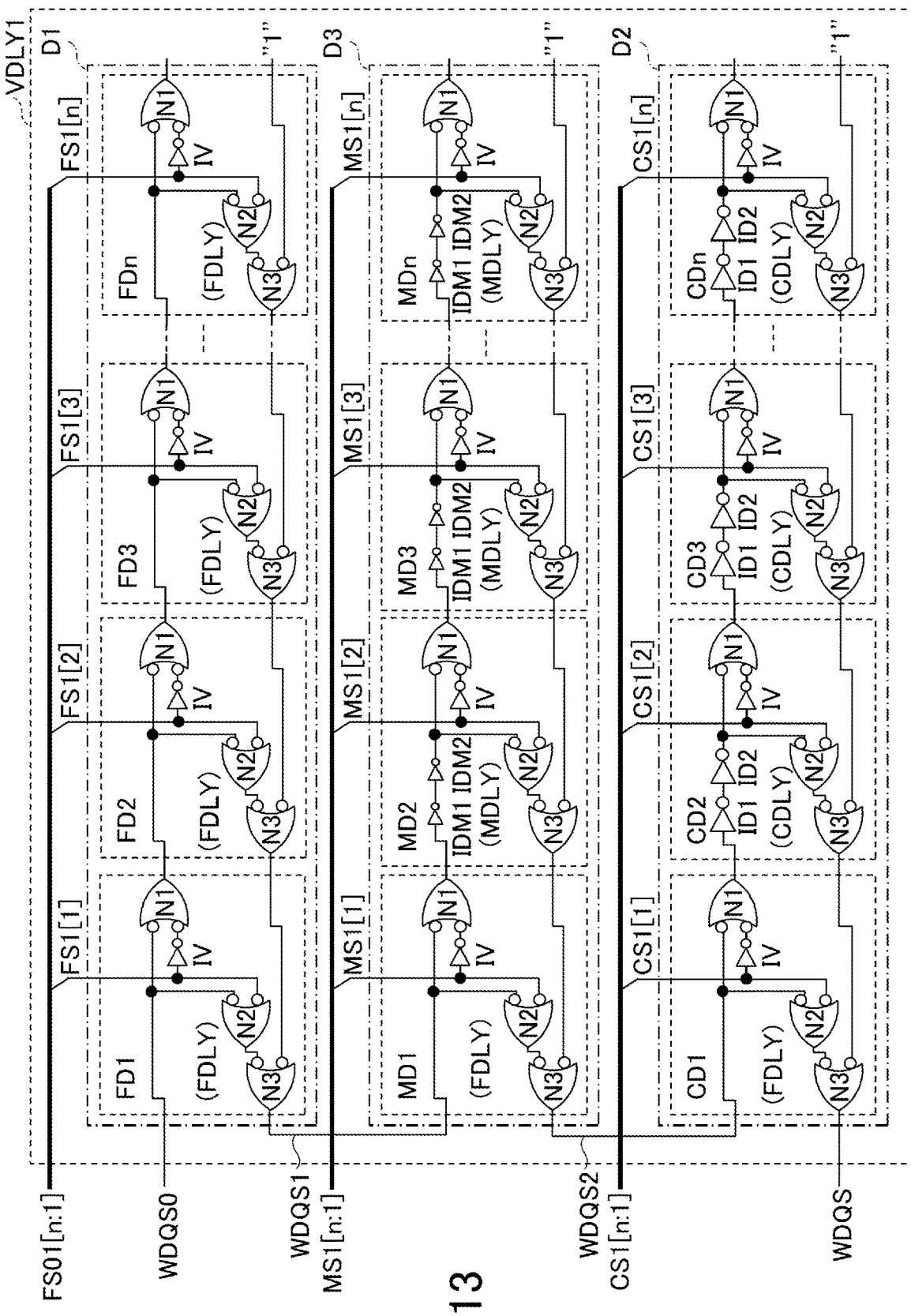
FIG. 13 is a diagram illustrating a circuit configuration of a variable delay circuit according to a fourth embodiment.

FIG. 13 illustrates a circuit configuration of a variable delay circuit according to a fourth embodiment. Elements substantially the same as the elements in FIG. 3 and FIG. 12 are referenced by the same reference numerals, and the detailed description is omitted. FIG. 13 illustrates an example of applying the fourth embodiment to the variable delay circuit VDLY1 illustrated in FIG. 1, but the fourth embodiment can be applied to the variable delay circuits VDLY2 and VDLY3 illustrated in FIG. 1. In the semiconductor integrated circuit 100, a configuration except for the variable delay circuits VDLY1-VDLY3 is substantially the same as the configuration in FIG. 1.

In the variable delay circuit VDLY1 illustrated in FIG. 13, the delay line D3 is connected between the delay line D1 and the delay line D2. The delay line D3 is an example of a third delay circuit. The circuit configuration of the delay line D1 and the delay line D2 is substantially the same as the circuit configuration in FIG. 3. The delay line D3 includes n delay elements MD (MD1-MDn). The delay element MD1 has the same circuit configuration ("FDLY") as the delay element FD1. The delay time duration of each of the delay elements MD2-MDn is longer than the delay time duration of the delay element FD1 and shorter than the delay time duration of the delay element CD2. The delay element MD1 is an example of a fourth delay element, and the delay elements MD2-MDn are examples of a fifth delay element.

Therefore, each of the delay elements MD2-MDn has delay inverters IDM1 and IDM2 having a delay time duration shorter than the delay time duration of the delay inverters ID1 and ID2, instead of the delay inverters ID1 and ID2 of the delay element CD2. Each of the delay elements MD2-MDn has a configuration substantially the same as the configuration of the delay element CD2 except that the delay inverters IDM1 and IDM2 are included instead of the delay inverters ID1 and ID2. Because the delay time duration of the delay elements MD2-MDn is identical to each other, the symbol "MDLY" (Middle Delay) is additionally illustrated in the drawing. The delay time duration of the delay elements MD2-MDn is an example of a third delay time duration.

The delay line D1 delays the write timing signal WDQS0 for a predetermined time duration and outputs the delayed signal as the delay signal WDQS1. The delay line D3 is controlled by a control signal MS1[n:1], delays the delay signal WDQS1 for a predetermined time duration, and outputs the delayed signal as the delay signal WDQS2. The delay line D2 delays the delay signal WDQS2 for a predetermined time duration and outputs the delayed signal as the delay write timing signal WDQS. The control signal MS1[n:1] is an example of a third control signal.

The delay control circuit 20 in FIG. 1 has a function to output the control signal MS1[n:1] in addition to the function described with reference to FIG. 1. Additionally, the delay control circuit 20 has a function to output a control signal MS2[n:1] to the variable delay circuit VDLY2. The control signal MS2[n:1] is used to adjust the delay time duration of the delay line D3 provided in the variable delay circuit VDLY2.

The variable delay circuit VDLY3 in FIG. 1 has a function to adjust the delay time duration of the delay line D3 provided in the variable delay circuit VDLY3 by using the control signal MS3[n:1], in addition to the function described with reference to FIG. 1. The DLL circuit 10 in FIG. 1 outputs the control signal MS3[n:1] to the delay control circuit 20.

The order of connections of the delay line D1, the delay line D3, and the delay line D2 is not limited to the order in FIG. 13. For example, the delay line D1, the delay line D2, and the delay line D3 may be connected in this order, and the delay line D3, the delay line D1, and the delay line D2 may be connected in this order.

In this embodiment, the effect substantially the same as the effect in the first embodiment can be obtained. For example, the delay elements MD1 and CD1 ("FDLY") having a delay amount smaller than the delay amount of the delay element "CDLY" are disposed at the first stages of the delay lines D3 and D2, so that the minimum delay amount of the variable delay circuits VDLY1-VDLY3 can be less than or equal to the delay amount of the delay element "CDLY". This enables a signal having a desired delay amount to be output, even when the operating frequency of the flash memory 200 is high, and the adjustment accuracy of the delay amount can be improved in the variable delay circuits VDLY1-VDLY3 that have a wide range of delay amounts.

Further, in this embodiment, each of the variable delay circuits VDLY1, VDLY2, and VDLY3 can use any number of delay elements "FDLY," "MDLY," and "CDLY" having three delay time durations, so that the delay time duration can be more accurately adjusted. Here, each of the variable delay circuits VDLY1, VDLY2, and VDLY3 may have four or more delay circuits having different delay time durations of delay elements as of the second stage. In this case, the first delay elements of respective delay circuits are connected in series.

Although the invention has been described based on the embodiments, the invention is not limited to the requirements described in the embodiments. These respects can be changed within the scope of the subject matter of the present invention without departing from the spirit of the invention and may be suitably defined according to the application.

What is claimed is:

1. A variable delay circuit comprising:
at least one first delay circuit including a plurality of first delay elements connected in series, each of the plurality of first delay elements having a first delay time duration, the at least one first delay circuit being configured to set each of the plurality of first delay elements, in accordance with a first control signal, to a return state in which a received signal is returned to an input side or to a transfer state in which the received signal is transferred to an output side and a signal received from the output side is transferred to the input side, and output a first delay signal from a first stage first delay element, the first stage first delay element being a first stage of the at least one first delay circuit among the plurality of first delay elements, and the first delay signal being obtained by delaying a signal received at the first stage first delay element; and
a second delay circuit including at least one second delay element and a plurality of third delay elements, the at least one second delay element having a same configuration as the plurality of first delay elements, each of the plurality of third delay elements having a second delay time duration longer than the first delay time duration, the at least one second delay element and the plurality of third delay elements being connected in series, the second delay circuit being configured to set each of the at least one second delay element and the plurality of third delay elements, in accordance with a second control signal, to a return state in which a received signal is returned to an input side or to a transfer state in which the received signal is transferred to an output side and a signal received from the output side is transferred to the input side, and output a second delay signal from a first stage second delay element, the first stage second delay element being a first stage of the second delay circuit among the at least one second delay element, and the second delay signal being obtained by delaying a signal received at the first stage second delay element,
wherein the first stage first delay element and the first stage second delay element are connected in series, and
wherein a delay signal obtained by delaying an input signal received at one circuit among the at least one first delay circuit and the second delay circuit for a predetermined time duration is output from another circuit among the at least one first delay circuit and the second delay circuit.

2. The variable delay circuit as claimed in claim 1, wherein the second delay time duration of each of the plurality of third delay elements is k times (k is an integer greater than or equal to 2) greater than the first delay time duration of each of the plurality of first delay elements.

3. The variable delay circuit as claimed in claim 1, further comprising at least one third delay circuit including at least one fourth delay element and a plurality of fifth delay elements, the at least one fourth delay element having the same configuration as the plurality of first delay elements, each of the plurality of fifth delay elements having a third delay time duration, the at least one fourth delay element and the plurality of fifth delay elements being connected in series, the at least one third delay circuit being configured to set each of the at least one fourth delay element and the plurality of fifth delay elements, in accordance with a third control signal, to a return state in which a received signal is returned to an input side or to a transfer state in which the received signal is transferred to an output side and a signal received from the output side is transferred to the input side, and output a third delay signal from a first stage fourth delay element, the first stage fourth delay element being a first stage of the at least third delay circuit among the at least one fourth delay element, and the third delay signal being obtained by delaying a signal received at the first stage fourth delay element,
wherein the first stage fourth delay element is connected to the first stage first delay element and the first stage second delay element in series.

4. The variable delay circuit as claimed in claim 2, further comprising at least one third delay circuit including at least one fourth delay element and a plurality of fifth delay elements, the at least one fourth delay element having the same configuration as the plurality of first delay elements, each of the plurality of fifth delay elements having a third delay time duration, the at least one fourth delay element and the plurality of fifth delay elements being connected in series, the at least one third delay circuit being configured to set each of the at least one fourth delay element and the plurality of fifth delay elements, in accordance with a third control signal, to a return state in which a received signal is returned to an input side or to a transfer state in which the received signal is transferred to an output side and a signal received from the output side is transferred to the input side, and output a third delay signal from a first stage fourth delay element, the first stage fourth delay element being a first stage of the at least third delay circuit among the at least one fourth delay element, and the third delay signal being obtained by delaying a signal received at the first stage fourth delay element,
wherein the first stage fourth delay element is connected to the first stage first delay element and the first stage second delay element in series.

5. A semiconductor integrated circuit comprising:
a first variable delay circuit; and
a delay control circuit configured to output a first control signal and a second control signal that control a delay time duration of the first variable delay circuit,
wherein the first variable delay circuit includes:
at least one first delay circuit including a plurality of first delay elements connected in series, each of the plurality of first delay elements having a first delay time duration, the at least one first delay circuit being configured to set each of the plurality of first delay elements, in accordance with the first control signal, to a return state in which a received signal is returned to an input side or to a transfer state in which the received signal is transferred to an output side and a signal received from the output side is transferred to the input side, and output a first delay signal from a first stage first delay element, the first stage first delay element being a first stage of the at least one first delay circuit among the plurality of first delay elements, and the first delay signal being obtained by delaying a signal received at the first stage first delay element; and a second delay circuit including at least one second delay element and a plurality of third delay elements, the at least one second delay element having a same configuration as the plurality of first delay elements, each of the plurality of third delay elements having a second delay time duration longer than the first delay time duration, the at least one second delay element and the plurality of third delay elements being connected in series, the second delay circuit being configured to set each of the at least one second delay element and the plurality of third delay elements, in accordance with the second control signal, to a return state in which a received signal is returned to an input side or to a transfer state in which the received signal is transferred to an output side and a signal received from the output side is transferred to the input side, and output a second delay signal from a first stage second delay element, the first stage second delay element being a first stage of the second delay circuit among the at least one second delay element, and the second delay signal being obtained by delaying a signal received at the first stage second delay element, wherein the first stage first delay element and the first stage second delay element are connected in series, and wherein a delay signal obtained by delaying an input signal received at one circuit among the at least one first delay circuit and the second delay circuit for a predetermined time duration is output from another circuit among the at least one first delay circuit and the second delay circuit.

6. The semiconductor integrated circuit as claimed in claim 5, wherein the delay control circuit changes the first control signal without changing the second control signal to adjust a delay amount of the input signal in a first mode, and wherein the delay control circuit changes the second control signal without changing the first control signal to adjust the delay amount of the input signal in a second mode.

7. The semiconductor integrated circuit as claimed in claim 6, further comprising:

a second variable delay circuit having a same configuration as the first variable delay circuit;

a phase comparator configured to compare a phase of a clock signal input to the second variable delay circuit with a phase of a delay clock signal output from the second variable delay circuit; and a clock delay adjuster configured to adjust a delay time duration of the second variable delay circuit to match the phase of the clock signal with the phase of the delay clock signal, wherein a period of the input signal is set as a period of the clock signal, and wherein the delay control circuit outputs the first control signal or the second control signal to adjust the delay time duration of the first variable delay circuit in accordance with the delay time duration of the second variable delay circuit that is adjusted by the clock delay adjuster.

8. The semiconductor integrated circuit as claimed in claim 7, wherein the clock delay adjuster adjusts a delay time duration of at least one first delay circuit of the second variable delay circuit in the first mode, and adjusts a delay time duration of a second delay circuit of the second variable delay circuit in the second mode.

9. The semiconductor integrated circuit as claimed in claim 5, further comprising an interface configured to receive a signal from a flash memory and output a signal to the flash memory, wherein the first variable delay circuit adjusts, in a case of writing write data to the flash memory, a delay amount of the write data with respect to a transition edge of a data strobe signal output to the flash memory.

10. The semiconductor integrated circuit as claimed in claim 6, further comprising an interface configured to receive a signal from a flash memory and output a signal to the flash memory, wherein the first variable delay circuit adjusts, in a case of writing write data to the flash memory, a delay amount of the write data with respect to a transition edge of a data strobe signal output to the flash memory.

11. The semiconductor integrated circuit as claimed in claim 7, further comprising an interface configured to receive a signal from a flash memory and output a signal to the flash memory, wherein the first variable delay circuit adjusts, in a case of writing write data to the flash memory, a delay amount of the write data with respect to a transition edge of a data strobe signal output to the flash memory.

12. The semiconductor integrated circuit as claimed in claim 8, further comprising an interface configured to receive a signal from a flash memory and output a signal to the flash memory, wherein the first variable delay circuit adjusts, in a case of writing write data to the flash memory, a delay amount of the write data with respect to a transition edge of a data strobe signal output to the flash memory.

13. The semiconductor integrated circuit as claimed in claim 5, further comprising an interface configured to receive a signal from a flash memory and output a signal to the flash memory, wherein the first variable delay circuit adjusts, in a case of reading read data from the flash memory, a delay amount of a data strobe signal output by the flash memory together with the read data, with respect to the read data.

14. The semiconductor integrated circuit as claimed in claim 6, further comprising an interface configured to receive a signal from a flash memory and output a signal to the flash memory, wherein the first variable delay circuit adjusts, in a case of reading read data from the flash memory, a delay amount of a data strobe signal output by the flash memory together with the read data, with respect to the read data.

15. The semiconductor integrated circuit as claimed in claim 7, further comprising an interface configured to receive a signal from a flash memory and output a signal to the flash memory,
wherein the first variable delay circuit adjusts, in a case of reading read data from the flash memory, a delay amount of a data strobe signal output by the flash memory together with the read data, with respect to the read data.

16. The semiconductor integrated circuit as claimed in claim 8, further comprising an interface configured to receive a signal from a flash memory and output a signal to the flash memory,
wherein the first variable delay circuit adjusts, in a case of reading read data from the flash memory, a delay amount of a data strobe signal output by the flash memory together with the read data, with respect to the read data.

\* \* \* \* \*